(12) United States Patent
Maas et al.

(10) Patent No.: US 11,123,773 B2
(45) Date of Patent: Sep. 21, 2021

(54) APPARATUS FOR AND A METHOD OF REMOVING CONTAMINANT PARTICLES FROM A COMPONENT OF AN APPARATUS

(71) Applicant: ASML Netherlands B.V., Veldhoven (NL)

(72) Inventors: Tim Peter Johan Gerard Maas, Heythuysen (NL); Bartolomeus Martinus Johannes Van Hout, Eindhoven (NL); Henricus Wilhelmus Maria Van Buel, 's-Hertogenbosch (NL); Floris Zoethout, Gendt (NL)

(73) Assignee: ASML Netherlands B.V., Veldhoven (NL)

( * ) Notice: Subject to any disclaimer, the term of this patent is extended or adjusted under 35 U.S.C. 154(b) by 64 days.

(21) Appl. No.: 16/234,190

(22) Filed: Dec. 27, 2018

(65) Prior Publication Data

US 2019/0201943 A1    Jul. 4, 2019

(30) Foreign Application Priority Data

Dec. 28, 2017  (EP) .................................... 17210857
Mar. 6, 2018  (EP) .................................... 18160148

(51) Int. Cl.
*B08B 6/00* (2006.01)
*G03F 7/20* (2006.01)

(52) U.S. Cl.
CPC .............. *B08B 6/00* (2013.01); *G03F 7/7065* (2013.01); *G03F 7/7085* (2013.01); *G03F 7/70916* (2013.01); *G03F 7/70925* (2013.01)

(58) Field of Classification Search
CPC ....................................................... B08B 6/00
(Continued)

(56) References Cited

U.S. PATENT DOCUMENTS 6,642,531 B1    11/2003  Powers
6,952,253 B2    10/2005  Lof et al.
(Continued)

FOREIGN PATENT DOCUMENTS

CN    101104173 A    1/2008
CN    105964626 A    9/2016
(Continued)

OTHER PUBLICATIONS

Office Action directed to related Taiwanese Patent Application No. 107145861, dated Nov. 14, 2019, with attached English-language translation; 20 pages.
(Continued)

*Primary Examiner* — Mark Spisich
(74) *Attorney, Agent, or Firm* — Sterne, Kessler, Goldstein & Fox P.L.L.C

(57) ABSTRACT

An apparatus (300) for removing contaminant particles (205) from a component (202, 204) of an apparatus (140, MT), the contaminant particles giving rise to an ambient electric field (E), the apparatus comprising: a collection region (301) for attracting the particles, wherein the ambient electric field is at least between the component and the collection region; and an electric field generator configured to establish an applied electric field between the collection region and the component to cause the particles to be transported from the component to the collection region, wherein the electric field generator is configured to determine the polarity of the applied electric field based on the ambient electric field.

14 Claims, 15 Drawing Sheets

(58) Field of Classification Search
USPC .................................... 15/1.51; 134/1, 1.3
See application file for complete search history.

(56) References Cited

U.S. PATENT DOCUMENTS

| | | |
|---|---|---|
| 2003/0011763 A1 | 1/2003 | Taniguchi et al. |
| 2004/0218157 A1 | 11/2004 | Bakker et al. |
| 2006/0033921 A1 | 2/2006 | Den Boef et al. |
| 2006/0066855 A1 | 3/2006 | Boef et al. |
| 2007/0091287 A1 | 4/2007 | Chang et al. |
| 2007/0256258 A1 | 11/2007 | Takayanagi |
| 2010/0078846 A1 | 4/2010 | Resnick et al. |
| 2010/0201963 A1 | 8/2010 | Cramer et al. |
| 2010/0328655 A1 | 12/2010 | Den Boef |
| 2011/0026032 A1 | 2/2011 | Den Boef et al. |
| 2011/0027704 A1 | 2/2011 | Cramer et al. |
| 2011/0037960 A1 | 2/2011 | Scaccabarozzi et al. |
| 2011/0043791 A1 | 2/2011 | Smilde et al. |
| 2011/0102753 A1 | 5/2011 | Van De Kerkhof et al. |
| 2011/0249244 A1 | 10/2011 | Leewis et al. |
| 2011/0310388 A1 | 12/2011 | Hill et al. |
| 2012/0044470 A1 | 2/2012 | Smilde et al. |
| 2012/0145183 A1* | 6/2012 | Ikari ............... H01L 21/67028 134/1 |
| 2012/0242970 A1 | 9/2012 | Smilde et al. |
| 2013/0141730 A1 | 6/2013 | Quintanilha |
| 2013/0235357 A1 | 9/2013 | Delgado et al. |
| 2014/0354983 A1 | 12/2014 | Kolchin et al. |
| 2014/0361152 A1 | 12/2014 | Maleev et al. |
| 2015/0279609 A1 | 10/2015 | Tanii et al. |
| 2016/0313654 A1 | 10/2016 | Zeng et al. |
| 2016/0370717 A1 | 12/2016 | Den Boef et al. |
| 2017/0102620 A1 | 4/2017 | Zijp et al. |
| 2017/0255112 A1 | 9/2017 | Van Leest et al. |
| 2019/0129315 A1 | 5/2019 | Tarabrin et al. |

FOREIGN PATENT DOCUMENTS

| | | | |
|---|---|---|---|
| EP | 1 329 773 A2 | | 7/2003 |
| EP | 1 628 164 A2 | | 2/2006 |
| EP | 2 365 347 A1 | | 9/2011 |
| JP | 2-43980 | * | 2/1990 |
| JP | 7-66266 | * | 3/1995 |
| JP | 7-161598 | * | 6/1995 |
| JP | 7-195046 | * | 8/1995 |
| JP | 2009-182222 | * | 8/2009 |
| WO | WO 2009/078708 A1 | | 6/2009 |
| WO | WO 2009/106279 A1 | | 9/2009 |
| WO | WO 2009/129960 A1 | | 10/2009 |
| WO | WO 2015/143378 A1 | | 9/2015 |

OTHER PUBLICATIONS

International Search Report directed to related International Patent Application No. PCT/EP2018/082964, dated Jan. 8, 2019; 5 pages.
Li et al., "Symmetries of cross-polarization diffraction coefficients of gratings," Journal of the Optical Society of America, vol. 17, No. 5, May 2000; pp. 881-887.
International Search Report and Written Opinion of the International Searching Authority directed to related International Patent Application No. PCT/EP2018/077598, dated Mar. 21, 2019; 12 pages.
International Search Report and Written Opinion of the International Searching Authority directed to related International Patent Application No. PCT/EP2018/082964, dated Jan. 8, 2019; 9 pages.

* cited by examiner

APPARATUS FOR AND A METHOD OF REMOVING CONTAMINANT PARTICLES FROM A COMPONENT OF AN APPARATUS

FIELD

The present disclosure relates to methods and apparatuses for removing contaminant particles from a component of an apparatus, optionally, a metrology apparatus.

BACKGROUND

In lithographic processes, it is desirable to make frequent measurements of the structures created, e.g., for process control and verification. Tools to make such measurement are typically called metrology tools (MET). Different types of inetrology tools for making such measurements are known, including scanning electron microscopes or various forms of scatterometer metrology tools.

Scatterometers are versatile instruments which allow measurements of the parameters of a lithographic process by having a sensor in the pupil or a conjugate plane with the pupil of the objective of the scatterometer, measurements usually referred to as pupil based measurements, or by having the sensor in the image plane or a plane conjugate with the image plane, in which case the measurements are usually referred to as image or field based measurements.

Such scatterometers and the associated measurement techniques are further described in patent applications US20100328655, US2011102753A1, US2012004470A, US20110249244, US20110026032 or EP1628164A, incorporated herein by reference in their entirety. Aforementioned scatterometers may measure gratings using radiation from soft x-ray, extreme ultraviolet (EUV) and visible to near-IR wavelength range.

Occasionally, contaminant particles such as polyester or cellulose particles/fibres may become attached to components in the metrology tool, e.g. to an optical objective forming part of a scatterometer. There are several potential sources of contaminant particles within a metrology tool, such as cleaning wipes used during servicing and maintenance of the tool. The semiconductor wafer containing the structure being measured may itself introduce contaminant particles into the metrology tool as a result of contamination in the wafer handling system or front opening unified pods (FOUPs) used to store and transport the wafers.

The inventors have recognized that such contaminant particles can, under certain circumstances, result in the metrology tool causing damage to the wafer under measurement, which is undesirable as it can result in lower yield. Contaminant particles may also impact the performance of the metrology tool in terms of accuracy, for example.

Accordingly, a problem addressed by the invention is how to remove contaminant particles from an apparatus. The apparatus may be a metrology tool.

SUMMARY OF THE INVENTION

According to an aspect of the present invention there is provided an apparatus for removing contaminant particles from a component of an apparatus, the contaminant particles giving rise to an ambient electric field, the apparatus comprising: a collection region for attracting the particles, wherein the ambient electric field is at least between the component and the collection region; and an electric field generator configured to establish an applied electric field between the collection region and the component to cause the particles to be transported from the component to the collection region, wherein the electric field generator is configured to determine the polarity of the applied electric field based on the ambient electric field.

According to a further aspect of the present invention there is provided an apparatus for removing contaminant particles from a component of an apparatus, the contaminant particles giving rise to an ambient electric field, the apparatus comprising: a collection region for attracting the particles, wherein the ambient electric field is at least between the component and the collection region; an electric field generator; and a processor configured to undertake the steps of: determining the polarity of the applied electric field based on the ambient electric field; and causing the electric field generator to establish an applied electric field between the collection region and the component to cause the particles to be transported from the component to the collection region.

The polarity of the applied electric field may be opposite to the polarity of the ambient electric field.

The electric field generator may be configured to determine a magnitude of the applied electric field based on one or more of: a magnitude of the ambient field; an estimate of an adhesion force holding the particles to the component; and an estimation of Van der Wads forces holding the particles to the component.

At least part of the collection region may be electrically conductive, and the electric field generator may comprise a voltage source arranged to establish the applied electric field by applying a voltage to the at least part of the collection region.

The apparatus may further comprise a field sensor configured, prior to establishing the applied electric field, to sense the polarity of the ambient electric field and optionally the magnitude of the ambient electric field.

The field sensor may comprise an electrically conductive element, and sensing the ambient electric field may comprise monitoring a voltage induced in the electrically conductive element by the ambient electric field.

The apparatus may be configured to allow a voltage of the electrically conductive element to be floating when sensing the ambient electric field.

The magnitude of the applied electric field may be determined based on at least one of a magnitude of the sensed ambient electric field and a distance between the component and the electrically conductive element and/or the collection region.

The collection region may comprise the electrically conductive element.

The apparatus may further comprise a field inducer configured, prior to establishing the applied electric field, to induce a further electric field in the region between the collection region and the component, while, optionally, the collection region touches the contaminant particles.

The component may be an objective of an optical system,

The magnitude of the applied voltage may be in the range from 0 V to 10 kV.

The magnitude of the applied voltage may be determined so as to prevent electrical breakdown between the component and the collection region.

The component may be held at ground potential.

The apparatus may further comprise an inspection unit configured to undertake an initial step of inspecting the component for particles, wherein the electric field generator is configured to establish the applied electric field in dependence on a threshold number of particles being detected on the component, The electric field generator may be configured to determine the polarity and/or magnitude of the applied electric field based on a library lookup from experimental data and/or an electrostatic finite element model of the apparatus, taking the polarity and/or magnitude of the ambient electric field as inputs.

Prior to establishing the applied electric field the component may be translated to be located directly above the collection region, or alternatively the collection region may be translated to be directly below the component.

The apparatus may further comprise a particle remover configured to remove the particles from the collection region.

The particle remover may comprise a vacuum pump, wherein removal of the particles from the collection region is by suction.

The apparatus may further comprise a cap for placement over the collection region, the cap having vents that are in fluid communication with the vacuum pump, and configured on operation of the vacuum pump to draw a gas therethrough, across the collection region and towards the vacuum pump.

The electric field generator may be configured to reduce the magnitude of the applied electric field before or during operation of the vacuum pump.

The electric field generator may be configured to remove the applied electric field before or during operation of the vacuum pump.

The electric field generator may be configured to reverse the polarity of the applied electric field before or during operation of the vacuum pump.

The apparatus may further comprise a guard at a periphery of the collection region, the guard being configured to hold the applied electric field in a region adjacent to the collection region.

At least part of the guard may be electrically conductive and held at ground potential.

The component may be a component of a metrology apparatus.

According to a further aspect of the present invention there is provided a method for removing contaminant particles from a component of an apparatus, the contaminant particles giving rise to an ambient electric field and the apparatus comprising a collection region for attracting the particles, wherein the ambient electric field is at least between the component and the collection region, the method comprising: determining, by an electric field generator, a polarity of an applied electric field based on the ambient electric field; and establishing, by the electric field generator, an applied electric field of the determined polarity between the collection region and the component to cause the particles to be transported from the component to the collection region.

Determining the polarity and/or magnitude of the applied electric field may be based on at least one of: a magnitude of the ambient electric field; an estimate of an adhesion force holding the particles to the component; and an estimate of the Van der Waals force holding the particles to the component.

The electric field generator may comprise a voltage source, and establishing the applied electric field may comprise the voltage source applying a voltage to a part of the collection region which is electrically conductive.

Prior to establishing the applied electric field, the polarity and/or magnitude of the ambient electric field may be sensed by a field sensor, The field sensor may comprise an electrically conductive element, and sensing the ambient electric field may comprise monitoring a voltage induced in the electrically conductive element by the ambient electric field.

A voltage of the electrically conductive element may be allowed to be floating when sensing the ambient electric field.

The method may further comprise determining the magnitude of the applied electric field based on at least one of a magnitude of the sensed ambient electric field and a distance between the component and the electrically conductive element and/or the collection region.

The method may further comprise inducing, by a field inducer and prior to establishing the applied electric field, a further electric field in the region between the collection region and the component, while, optionally, allowing the collection region to touch the contaminant particles.

The magnitude of the applied voltage may be in the range from 0 V to 10 kV.

The method may further comprise determining the magnitude of the applied voltage so as to prevent electrical breakdown between the component and the collection region.

The method may further comprise holding the component at ground potential.

The method may further comprise an initial step of inspecting, by an inspection unit, the component for particles, and the electric field generator establishing the applied electric field in dependence on a threshold number of particles being detected on the component.

The method may further comprise the electric field generator determining the polarity and/or magnitude of the applied electric field based on a library lookup from experimental data and/or an electrostatic finite element model of the apparatus, taking the polarity and/or magnitude of the ambient electric field as inputs.

Prior to establishing the applied electric field, the component may be translated to be located directly above the collection region or alternatively the collection region may be translated to be located directly below the component.

The method may further comprise a particle remover removing the particles from the collection region.

The particle remover may comprise a vacuum pump, wherein removal of the particles from the collection region is by suction.

The method may further comprise placing a cap over the collection region, the cap having vents that are in fluid communication with the vacuum pump, and operating the vacuum pump to draw a gas therethrough, across the collection region and towards the vacuum pump.

The method may further comprise the electric field generator reducing the magnitude of the applied electric field before or during operation of the vacuum pump.

The method may further comprise removing the applied electric field before or during operation of the vacuum pump.

The method may further comprise the electric field generator reversing the polarity of the applied electric field before or during operation of the vacuum pump.

The method may further comprise holding a guard located at a periphery of the collection region at ground potential to hold the applied electric field in a region adjacent to the collection region, According to a further aspect of the present invention, a computer program is provided, the computer program comprising instructions which, when executed on at least one processor, cause the at least one processor to control an apparatus to carry out a method according to the above aspect of the invention.

According to a further aspect of the present invention, a carrier is provided containing the computer program according to the above aspect of the invention. The carrier may be one of an electronic signal, optical signal, radio signal, or non-transitory computer readable storage medium, According to a further aspect of the present invention, a metrology apparatus is provided which comprises the apparatus according to the above aspect of the invention.

According to a further aspect of the present invention, a lithographic apparatus is provided which comprises the metrology apparatus according to the above aspect of the invention.

According to a further aspect of the present invention, a lithographic cell is provided which comprises the metrology apparatus according to the above aspect of the invention.

The invention aims to enable the removal of contaminant particles from a component of an apparatus, such as a metrology apparatus, ore more specifically, a scatterometer, in a controlled manner and without the risk of actually introducing further contamination into the apparatus or spreading the existing contamination elsewhere within the apparatus.

The invention aims to enable the removal of contaminant particles in a non-contact manner which reduces the risk of damaging components of the apparatus being cleaned, e.g. scratching of optical components by means of cleaning wipes and the like.

The invention also aims to provide a fast and non-invasive manner in which to remove contaminant particles from an apparatus, thereby reducing downtime of the apparatus being cleaned and hence interrupting a production cycle far less than known techniques, such as using cleaning wipes.

The invention also aims to provide a low-cost manner in which to remove contaminant particles from a apparatus since it is not necessary to open the metrology apparatus which would require a technician or team of technicians to be present.

BRIEF DESCRIPTION OF THE DRAWINGS

Embodiments will now be described, by way of example only, with reference to the accompanying drawings in which.

DETAILED DESCRIPTION OF EXEMPLARY EMBODIMENTS

Before describing the invention in detail, it is instructive to present an example environment in the present invention may be implemented.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
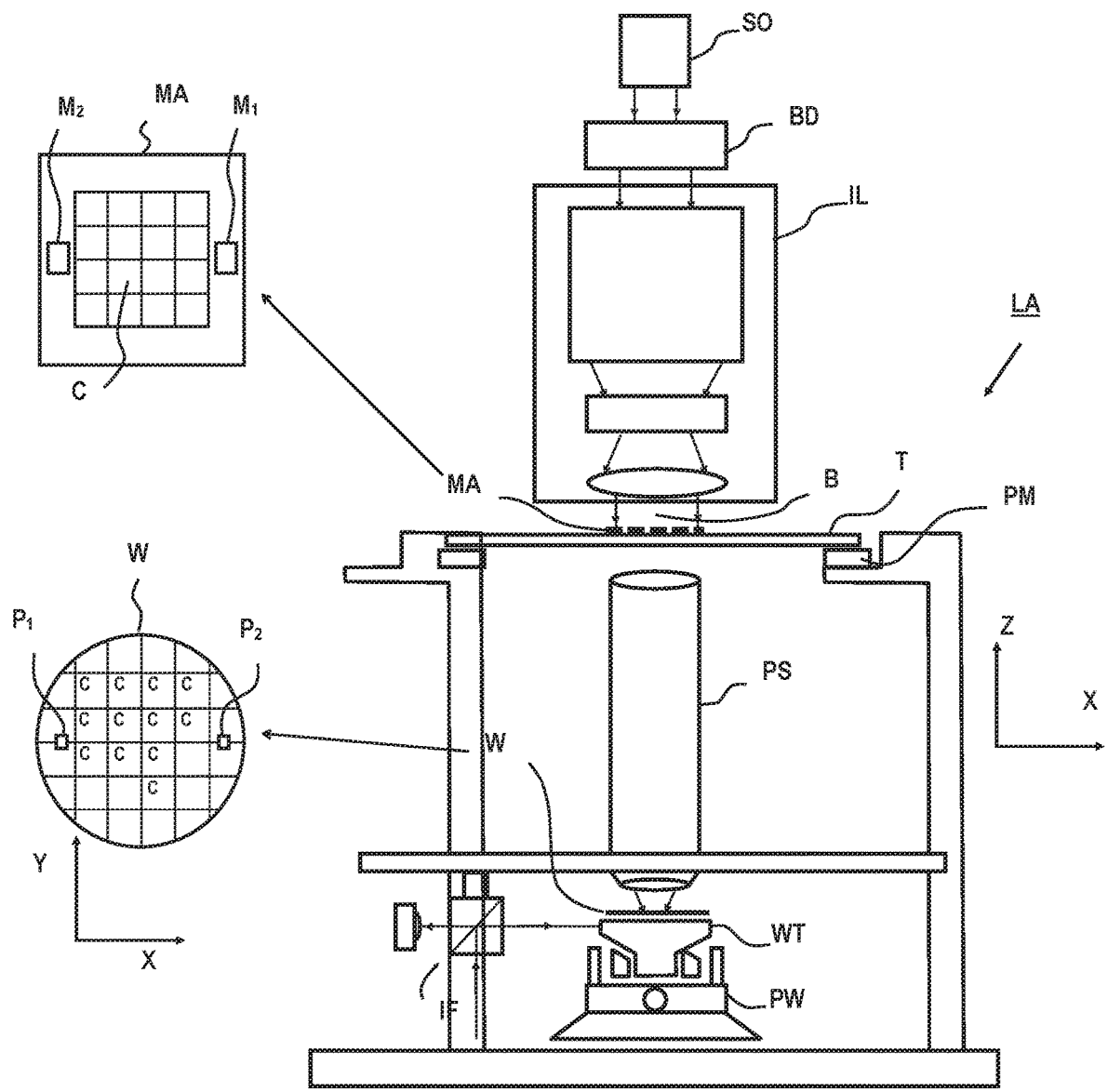
FIG. 1 illustrates a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may he used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in Figure I) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
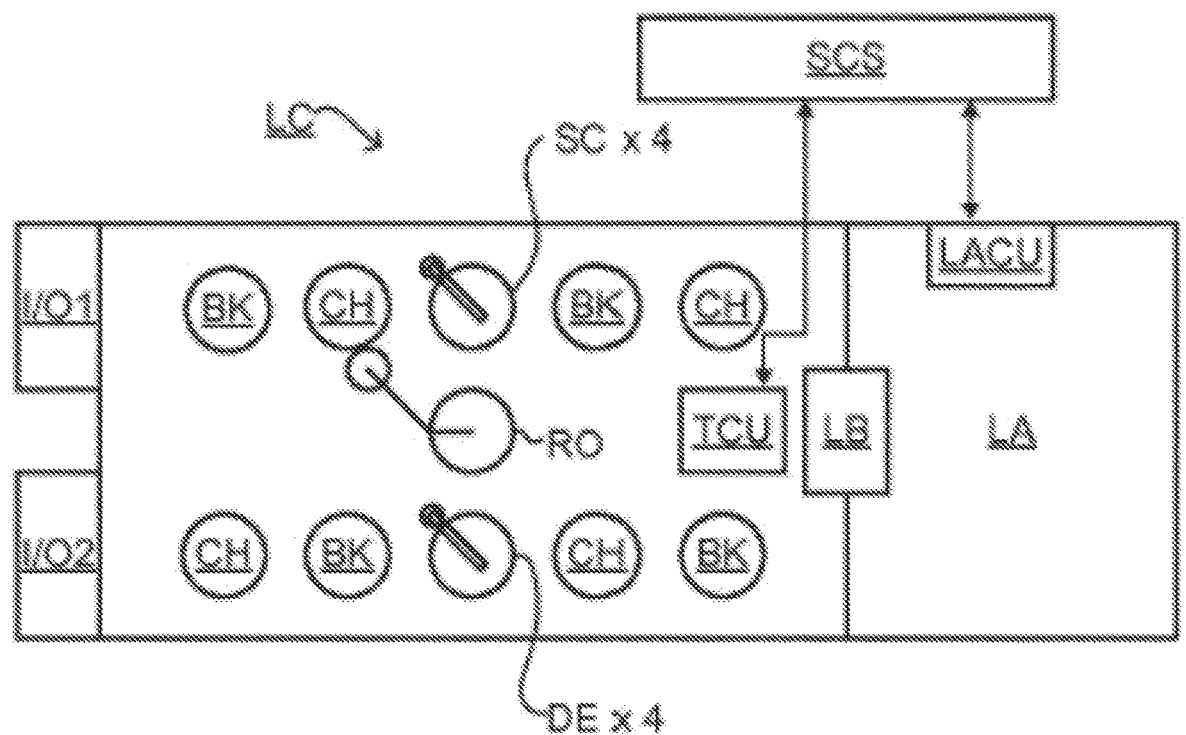
FIG. 2 illustrates a schematic overview of a lithographic cell.

As shown in FIG. 2 the lithographic apparatus LA may form part of a lithographic cell LC, also sometimes referred to as a lithocell or (litho)cluster, which often also includes apparatuses to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates \V, especially if the inspection is done before other substrates W of the same batch or lot are still to be exposed or processed.

An inspection apparatus (i.e. inspection tool), which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
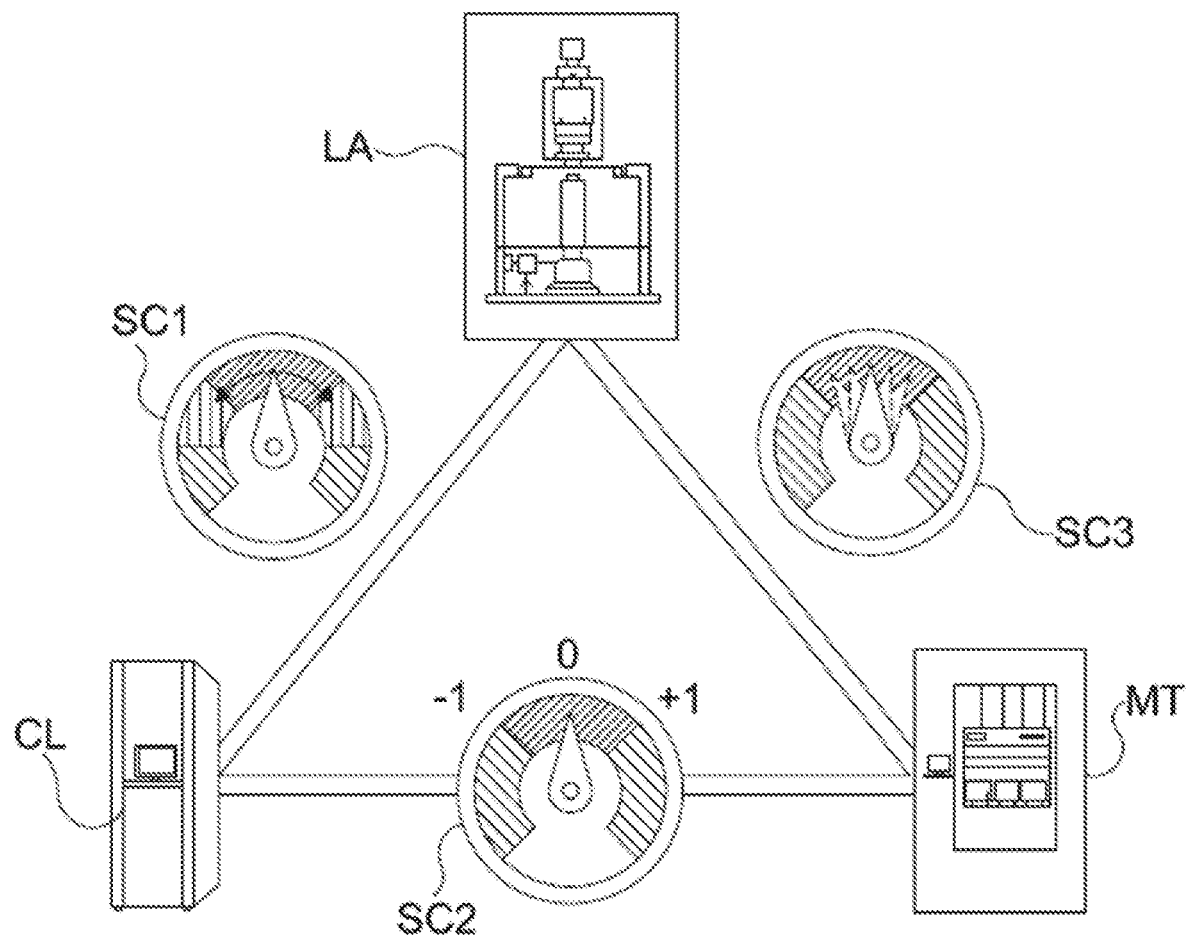
FIG. 3 illustrates a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may he present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

Figure 4A:
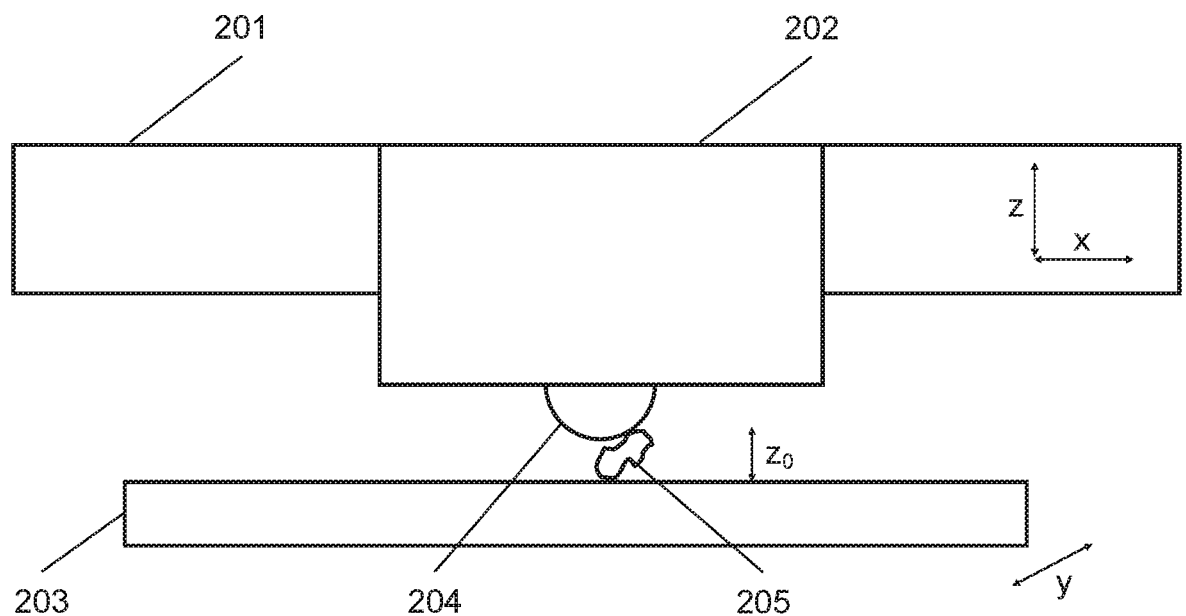
FIGS. 4a and 4b illustrate components of a metrology apparatus.
Figure 4B:
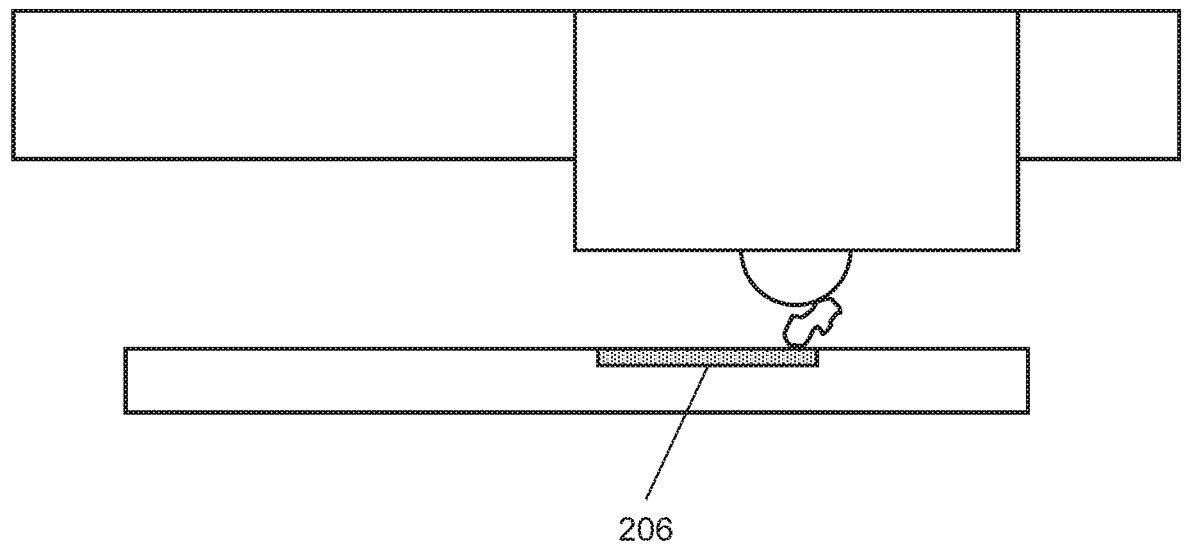

FIGS. 4a and 4b illustrate part of an apparatus, such as a metrology apparatus/tool MT, such as a scatterometer described above. A component of the tool MT, which in this case is an objective 202, is mounted on a translation stage 201 which can move the objective along two directions x and z. The objective 202 is used to focus illumination radiation onto a target portion of the semiconductor wafer 203 under measurement, and/or to collect radiation diffracted/reflected from the target portion of the semiconductor wafer 203 under measurement. The semiconductor wafer 203 is typically clamped on a wafer table WT which can be translated in the y direction as well as being rotatable about an axis through the centre of the wafer 203. The objective 202 may be a single lens/mirror 204 or an optical package containing a number of lenses, including an outermost lens element 204 which is the part of the objective most proximate the semiconductor wafer during measurement. The separation between the lens 204 and the surface of the semiconductor wafer 203 is denoted z0 and may he in the region of 100 µm to 500 µm during a typical scatterometry measurement.

The inventors have appreciated that from time to time contaminant particles 205 may be present within the metrology apparatus MT which may be attracted and retained on the bottom or side of the objective 202 at or near the lens 204. The contaminant particles 205 could be fibres of polyester or cellulose. A possible source of such particles could be cleaning wipes which are used during maintenance of the metrology apparatus MT. The possible forces involved in the attraction and retention of particles on components of the metrology apparatus MT, such as the objective 202, include gravitational force, adhesive force (e.g. ˉVan der Wants force), and electrostatic force.

The separation z0 between the lens 204 and the surface of the semiconductor wafer 203 may be approximately the same order of magnitude as the size of a typical contaminant particle 205 present within the metrology apparatus MT. This is illustrated in FIG. 4a where the contaminant particle 205 which is retained on the lens 204 by e.g. an electrostatic force is also in brushing contact with the top surface of the semiconductor wafer 203. As the objective 202 is moved, e.g. in the x direction by means of the translation stage 201, provided that the force holding the particle 205 to the lens 204 is greater than any dragging force exerted on the particle 205 through its contact with the surface of the semiconductor wafer 203, the particle will remain attached to the lens 204 and therefore will be transported with the lens 204 to the new location across the surface of the semiconductor wafer. However, the inventors have appreciated that this will result in the particle 205 leaving a trail of defects on the surface of the semiconductor wafer 203, represented by the region 206 in FIG. 4b. Such defects 206 have been found to impact the integrity of the fabricated semiconductor devices and are clearly undesirable. Accordingly, the inventors have developed a solution for the removal of such contaminant particles 205 in order to decrease or eradicate instances of defects 206 and thereby increase yield.

Figure 5:
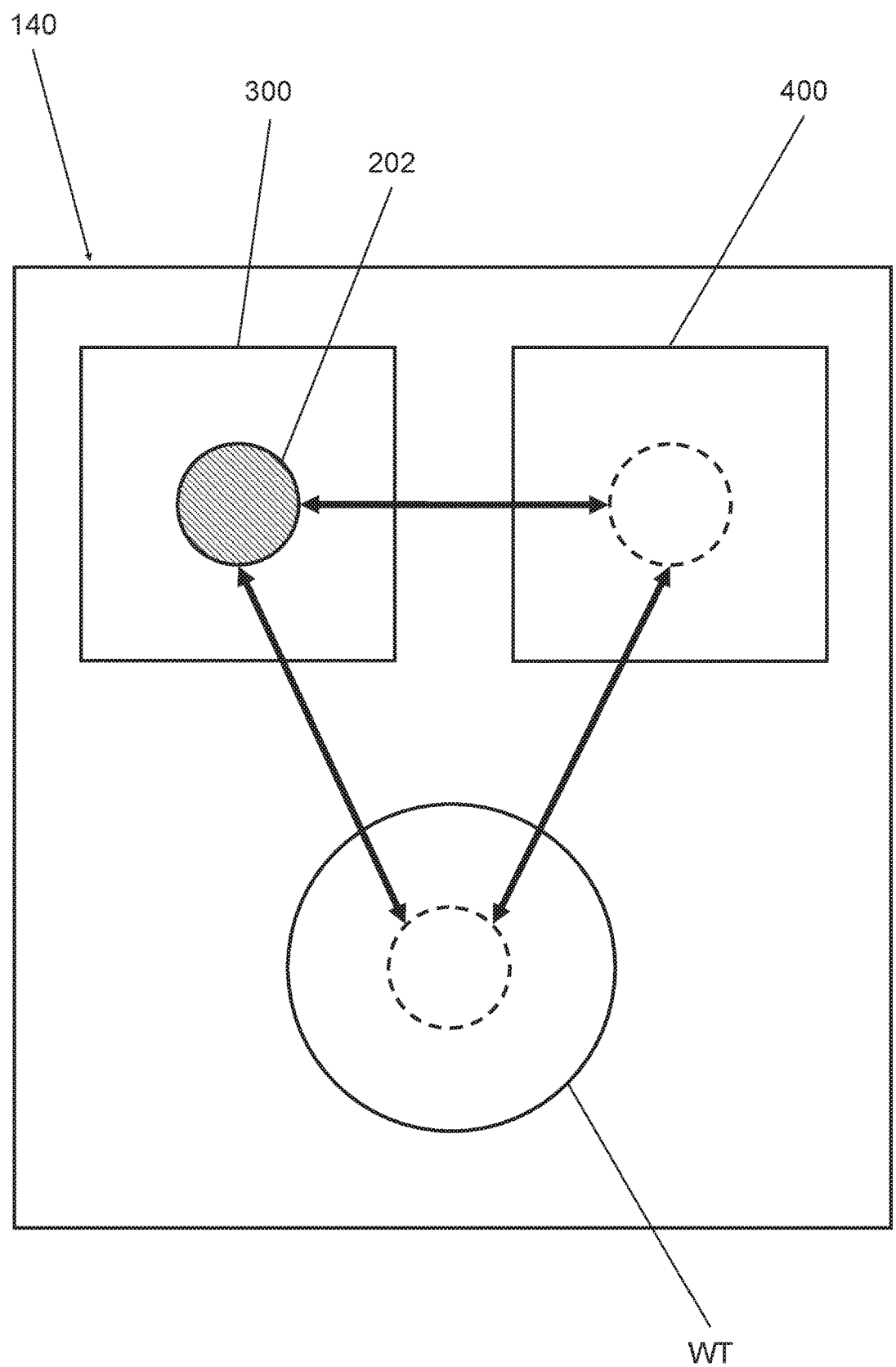
FIG. 5 is schematic representation of regions of a metrology apparatus.

FIG. 5 illustrates a schematic representation of parts of a typical metrology apparatus MT. Specifically, three regions are shown in addition to the objective 202 which as described above is mounted on a translation stage 201 for moving the objective 202, and other associated elements, between the various regions—as represented by the bold arrows between the three regions. The first region is the wafer table WT which is configured to hold a semiconductor wafer 203 in place during measurement of the wafer. The second region is an apparatus 300 for removing contaminant particles 205 from a component of the apparatus, such as the objective 202 and more specifically the lens 204 of the objective. The third region is an inspection unit 400 for inspecting the objective 202, to determine whether contaminant particles 205 are present. The inspection unit 400 and apparatus 300 for removing contaminant particles from the wafer 203 are described in more detail below. It is to he understood that the metrology apparatus MT may contain further elements and regions which are not illustrated in FIG. 5. Further, FIG. 5 is only a schematic representation of the different regions and these may be located in different geometries than as depicted. It will also be appreciated that in alternative arrangements the objective may not be mounted on a translation stage and instead other elements of then metrology apparatus may move with respect to the objective. For example, the wafer table may be sufficiently translatable with respect to the objective that the objective can be fixedly mounted with respect to the outer housing of the apparatus.

Figure 6A:
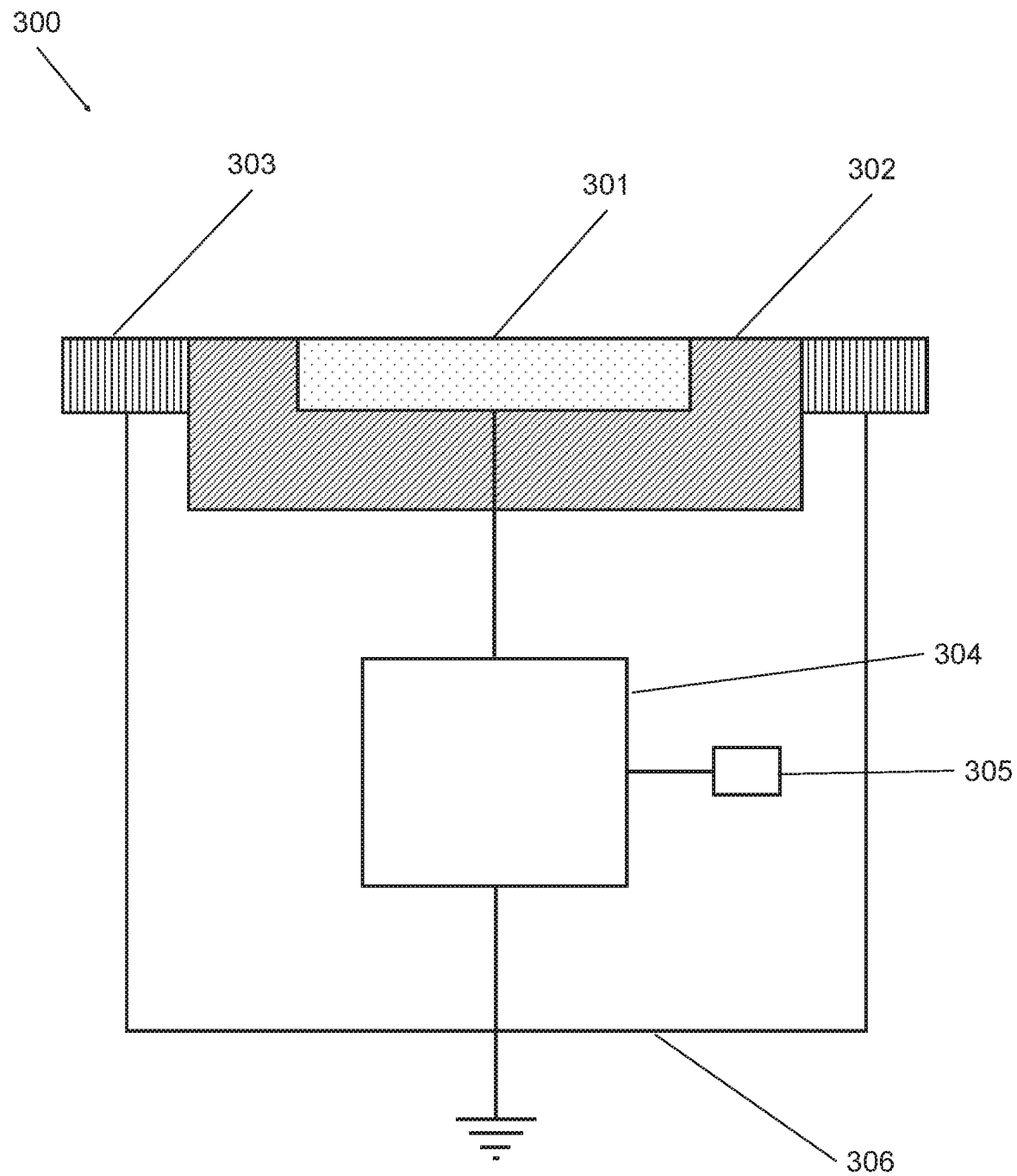
FIGS. 6a and 6b illustrate an apparatus for removing contaminant particles from a component of a metrology apparatus.
Figure 6B:
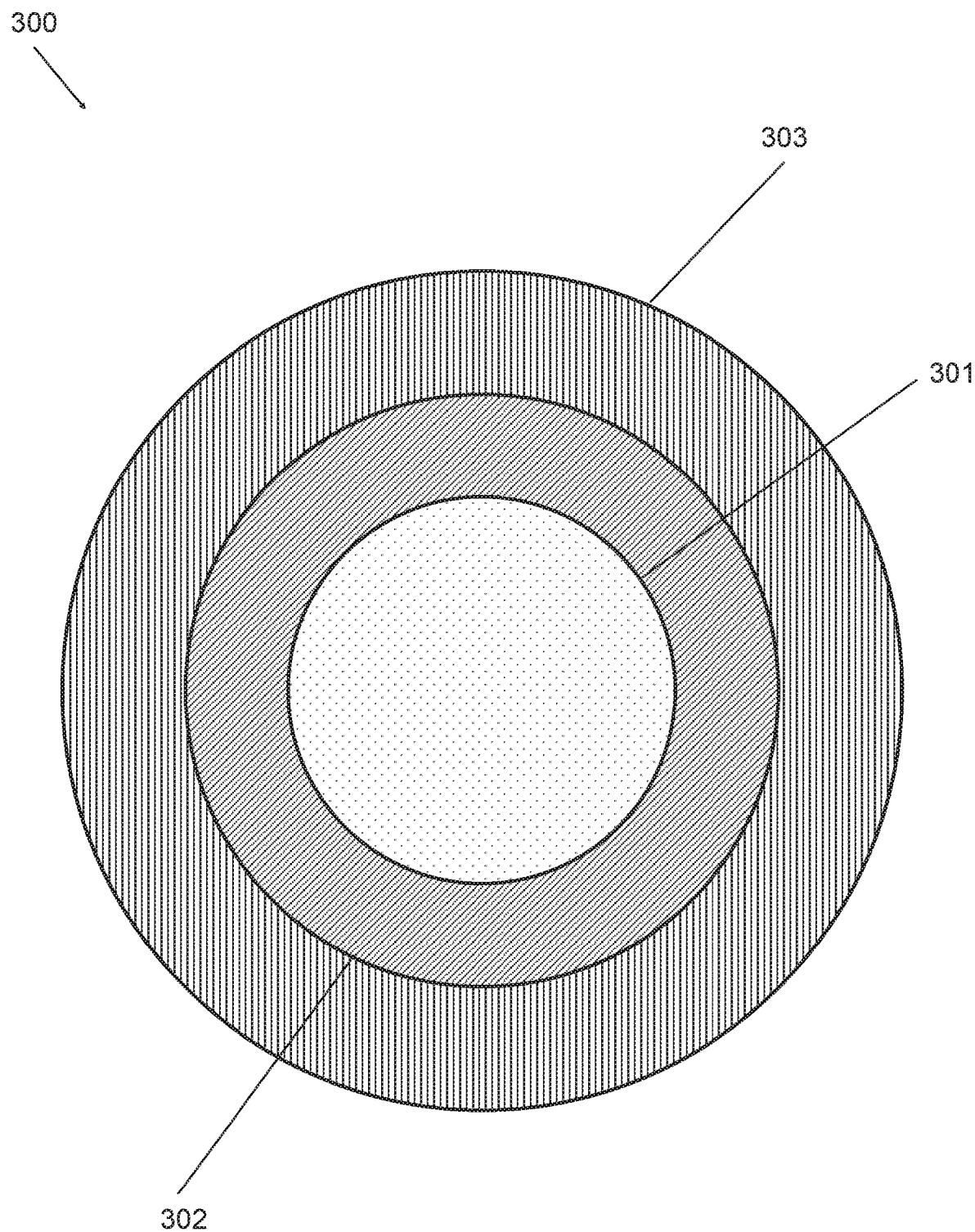

FIG. 6a illustrates an exemplary apparatus 300 for removing contaminant particles 205 from a component of the metrology apparatus MT. The component may be the objective 202 and more specifically the outermost lens 204 of the objective 202 forming part of the metrology apparatus MT described above. The apparatus comprises a collection region 301, which is herein referred to as a particle collection region 301, for attracting and optionally retaining contaminant particles 205 from the component. In this example the particle collection region 301 is a substantially circular disc formed from a conductive material such as metal and may be termed a collection plate. Surrounding the particle collection region 301 is an electrically insulating layer 302 formed of e.g. polytetrafluoroethylene (PTFE). The electrically insulating layer 302 is arranged to surround the particle collection region 301 on three sides, leaving only the top surface of the particle collection region exposed. At a periphery of the particle collection region 301 is a guard 303 that is configured to hold an applied electric field in a region adjacent the particle collection region 301, e.g. between the collection region 301 and the objective 202. The guard 303 surrounds the electrically insulating layer 302 and is held at ground potential via an electrical connector 306. The guard ring is preferably manufactured from metal and has a controlled connection to ground potential such that the guard ring is only connected to ground during operation of the apparatus 300 as described herein, i.e. whilst performing particle removal from the objective. More specifically, the guard ring is preferably arranged to be electrically floating, whilst the objective approaches the collection region (or vice versa) and only connected to ground at approximately the same time that the applied electric field is established in the region between the objective and the particle collection region. If the guard ring were held at ground potential whilst the objective approached the collection region then the guard ring could unintentionally attract the contaminant particle in an uncontrolled manner. In such an uncontrolled attraction there may be little or no knowledge about the location of the particle on the collection region/guard ring such that further permanent removal of the contaminant particle by means of the particle remover described below is not guaranteed to be successful. The functions of the guard 303 and particle collection region 301 are described in more detail below. The particle collection region 301 is electrically connected to a combined high voltage supply unit and voltage sensing device 304. It will be understood that the high voltage supply unit and voltage sensing device 304 could also be provided as two separate units, separately connected to the particle collection region 301 by means of a switch such that at any time only one of the voltage supply unity and voltage sensing device is in electrical contact with the particle collection region 301. In the case of the combined high voltage supply unit and voltage sensing device 304 a switch is provided internally to switch the particle collection region 301 between the high voltage supply and the voltage sensing device. The combined high voltage supply unit and voltage sensing device 304 is connected to an external power supply such as a mains electricity supply 305. FIG. 6b illustrates a top-down, or plan, view of the apparatus 300 showing the concentric ring-like geometry of the particle collection region 301, insulating layer 302 and guard 303.

Although in the above and the following paragraphs reference is made to a metrology apparatus that comprises the component, the apparatus for removing the contaminant particle may also be suitable for use in any apparatus that has a component on which a contaminant particle may be present.

Figure 7A:
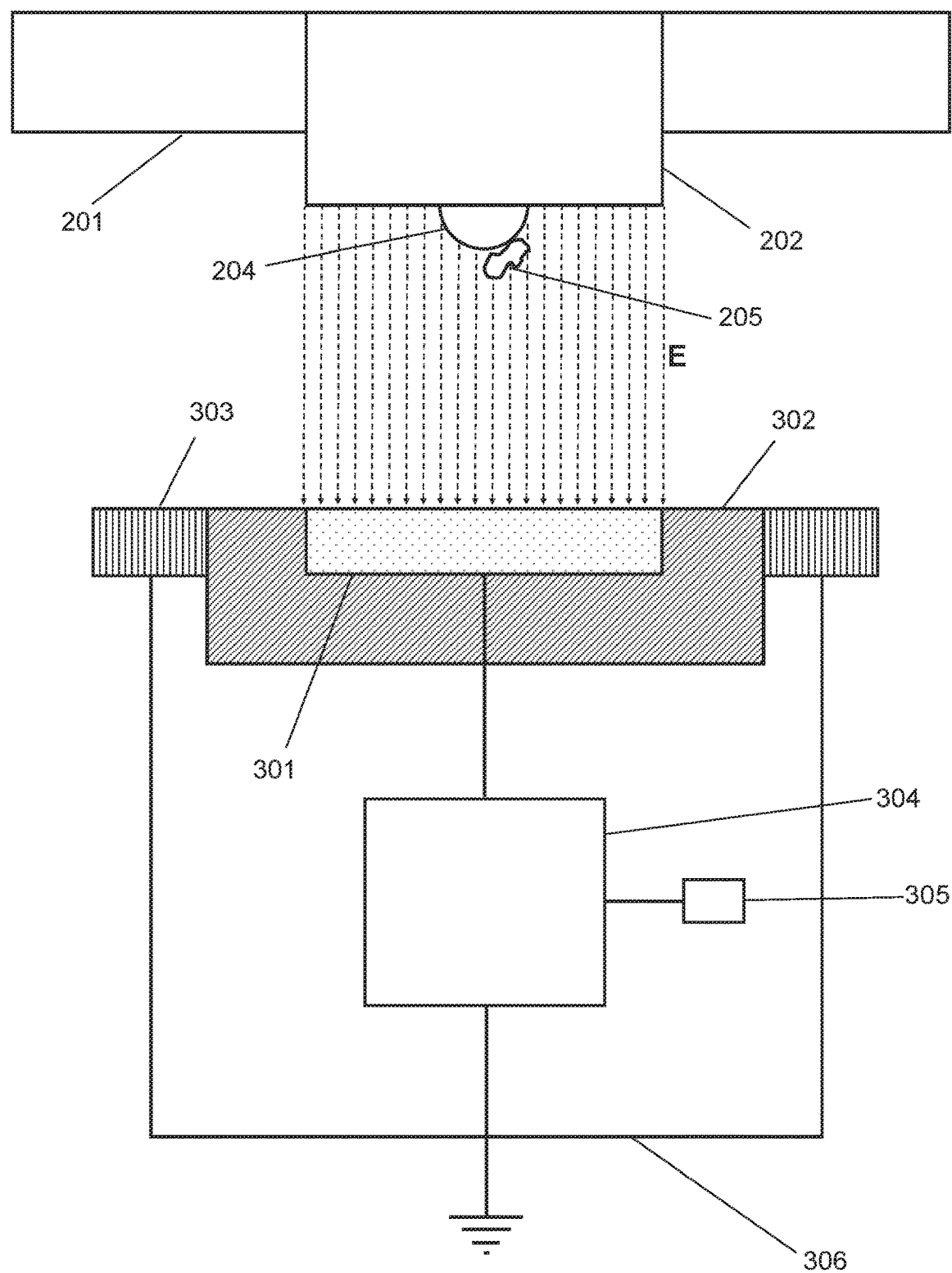
FIGS. 7a to 7c illustrate the use of the apparatus of FIGS. 6a and 6b in removing contaminant particles from a component of a metrology apparatus.
Figure 7B:
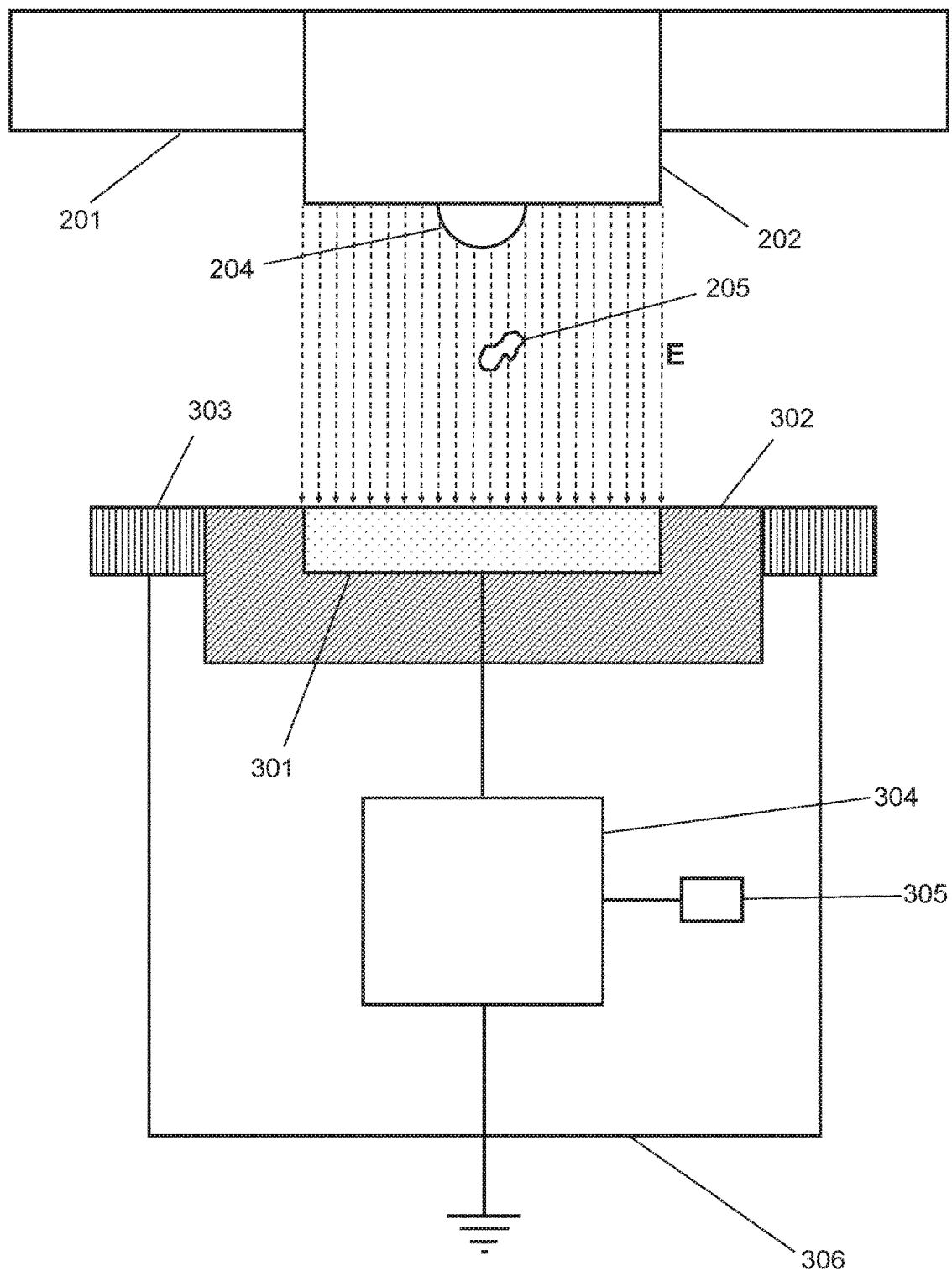
Figure 7C:
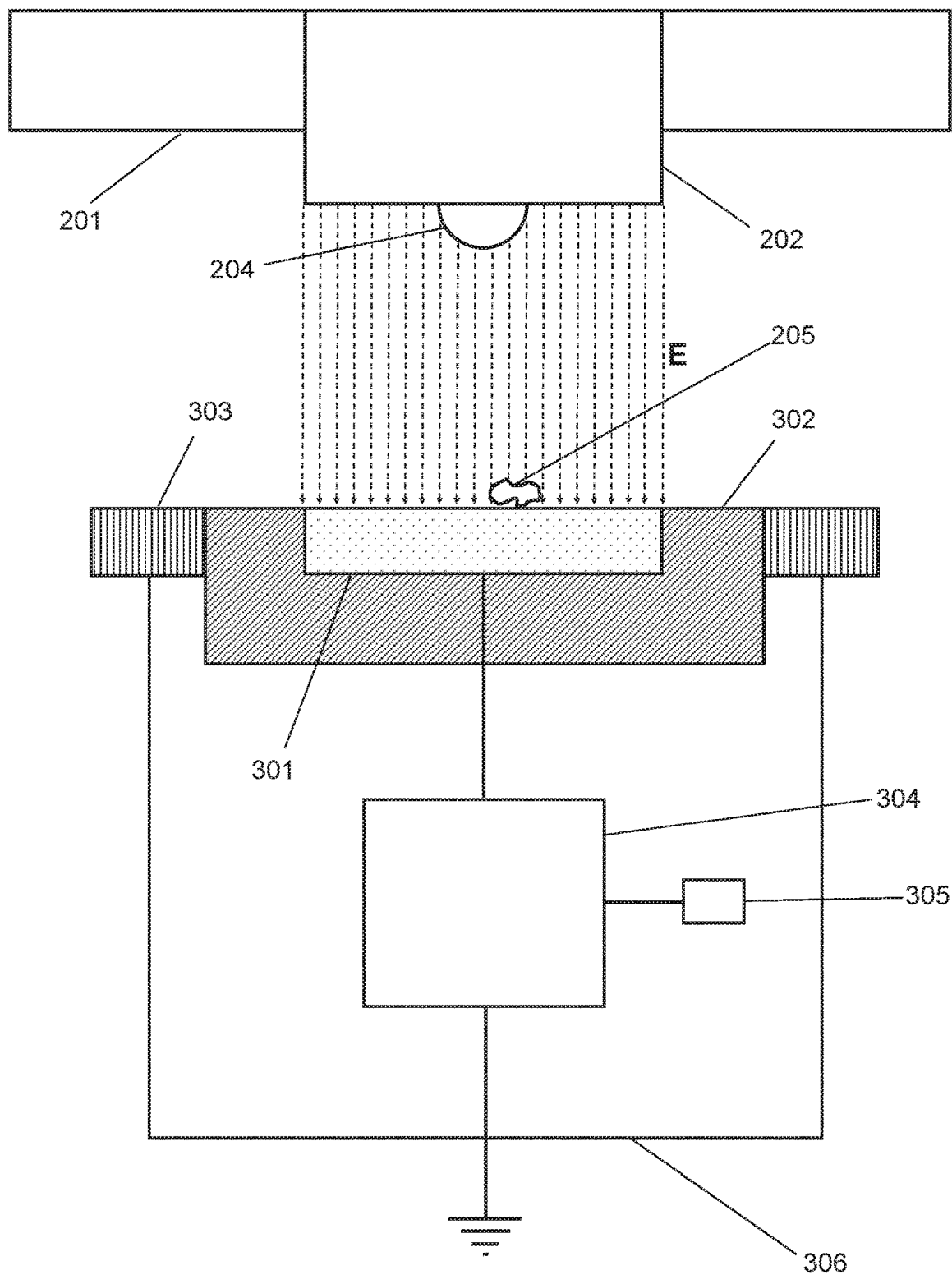

The operation of the apparatus 300 for removing contaminant particles 205 from a component of the metrology apparatus MT is described with reference to FIGS. 7a to 7c. In FIGS. 7a to 7c the outermost lens 204 of the objective 202 has a contaminant particle 205 attached to it, e.g. by a combination of an adhesive and electrostatic force. It is desired to remove the particle 205 by means of the apparatus 300. Accordingly, the objective 202 has been moved by means of the translation stage 201 to be situated directly above the particle collection region 301 of the apparatus 300. Ideally the objective 202 is located directly above the centre of the particle collection region 301 for removal of the contaminant particle 205. It will be appreciated that other geometries and configurations of the apparatus 300 could be chosen, such as for example a square or rectangular shape for the particle collection region 301.

If a contaminant particle 205 is attached to the lens 204 at least partially by an electrostatic force then the particle 205 will necessarily exhibit a charge distribution giving rise to local/ambient electric field around the particle 205. The term "ambient electric field" is used herein to refer to the electric field generated by the contaminant particle, i.e. the electric field which arises in the region surrounding the contaminant particle as a result of the charge distribution on the particle. This ambient electric field will have a particular magnitude and polarity depending on the charge distribution on the contaminant particle 205 and on the surface of the lens 204. If the particle 205 is placed in an externally-applied electric field E then it is to be expected that the particle 205 will experience an additional electrostatic force as a result of the interaction of the particle's charge distribution/ambient electric field with the applied electric field E. The inventors have appreciated that this additional electrostatic force may be employed to remove the particle 205 from the surface of the lens 204 by effectively overcoming the electrostatic force, along with any other adhesive forces, which holds the contaminant particle 205 to the lens 204.

In FIGS. 7a to 7c a high voltage is applied to the particle collection region 301 by means of the combined high voltage supply unit and voltage sensing device 304. The magnitude of the high voltage is typically in the range of 0 to 10 kV. The objective 202 is constructed from a plurality of metal parts including casing components and mounts for holding the lenses. Typically, the metal parts of the objective 202 will be held at ground potential. Accordingly, with a high voltage applied to the particle collection region 301 an applied electric field E is established in the region between the particle collection region 301 and the objective 202, as illustrated schematically by means of the dashed arrows in FIGS. 7a to 7c. As previously mentioned, the contaminant particle 205 has a charge distribution and will interact with the applied electric field E. The polarity of the applied electric field E will directly depend on the polarity of the high voltage which is applied to the particle collection region 301 by means of the combined high voltage supply unit and voltage sensing device 304. The combined high voltage supply unit and voltage sensing device 304 may be configured to generate either a positive or negative high voltage with respect to ground potential. The electrically insulating layer 302 isolates other components of the apparatus 300, and the wider metrology apparatus in which apparatus 300 is employed, from the high voltage which is applied to the particle collection region 301. Since the guard 303 is held at ground potential the guard has the effect of preventing the applied electric field E spreading to other regions of the metrology apparatus MT. In other words, the guard 303 helps to confine the applied electric field E to the immediate region between the particle collection region 301 and the component to be cleaned, e.g. the objective 202 and lens 204.

In order to remove the particle 205 most effectively, the inventors appreciate that the polarity of the applied electric field E should be opposite from the polarity of the ambient electric field caused by the particle itself. This is because the electrostatic force experienced by a particle having charge q in an applied vector electric field E is given by F=qE. Thus for a positively charged particle to experience a negative force (away from the component) the applied electric field should be in the negative direction (away from the component), whereas for a negatively charged particle to experience a negative force (away from the component) the applied electric field should be in the positive direction (towards the component). Since the objective is typically held at ground potential, the direction of the applied electric field will be positive when a positive voltage is applied to the particle collection region 301 and negative when a negative voltage is applied to the particle collection region. Further, aside from the polarity of the applied electric field, the magnitude of the applied electric field E should also be determined in accordance with the magnitude of the ambient electric field. For example, a larger ambient electric field implies a greater electrostatic force holding the contaminant particle onto the component and therefore an applied electric field having a greater magnitude will be required to attract the particle away from the component. The invention provides at least one method for determining the polarity and magnitude of the applied electric field E (and by association therefore also the magnitude and polarity of the voltage applied to the particle collection region 301) in order to most effectively remove contaminant particles 205 from the component by applied electrostatic force.

In the above description, the particle collection region 301 is used both as the sensing element for sensing the ambient electric field and as the conductive element to which the high voltage is applied to generate the applied electric field. The operation of the sensing element is discussed in more detail in the context of FIG. 11. This is because in the above example the collection region is electrically conductive. It will be appreciated that alternatively, the particle collection region may comprise separate electrically conductive portions/elements for performing the two functions of sensing the ambient electric field and generating the applied electric field. Further, the sensing of the ambient electric field may be made using a conductive element which does not form part of the particle collection region.

In the above description and also in the description hereafter it has been mentioned that the polarity and magnitude of the applied electric field F may depend on the polarity and magnitude of the ambient electric field around the particle 205. It is to be noted that it is not necessary to determine the magnitude of the applied electric filed in dependence of the polarity and magnitude of the ambient electric field around the particle 205. It is to be noted that it is not necessary for determining the polarity of the applied electric field E that the magnitude of the ambient electric field around the particle 205 is known. In other words, at least the polarity of the applied electric field E depends on the polarity of the ambient electric field around the particle 205 such that an electro static force to the contaminant particle is towards the particle collection region instead of towards the component.

Figure 8A:
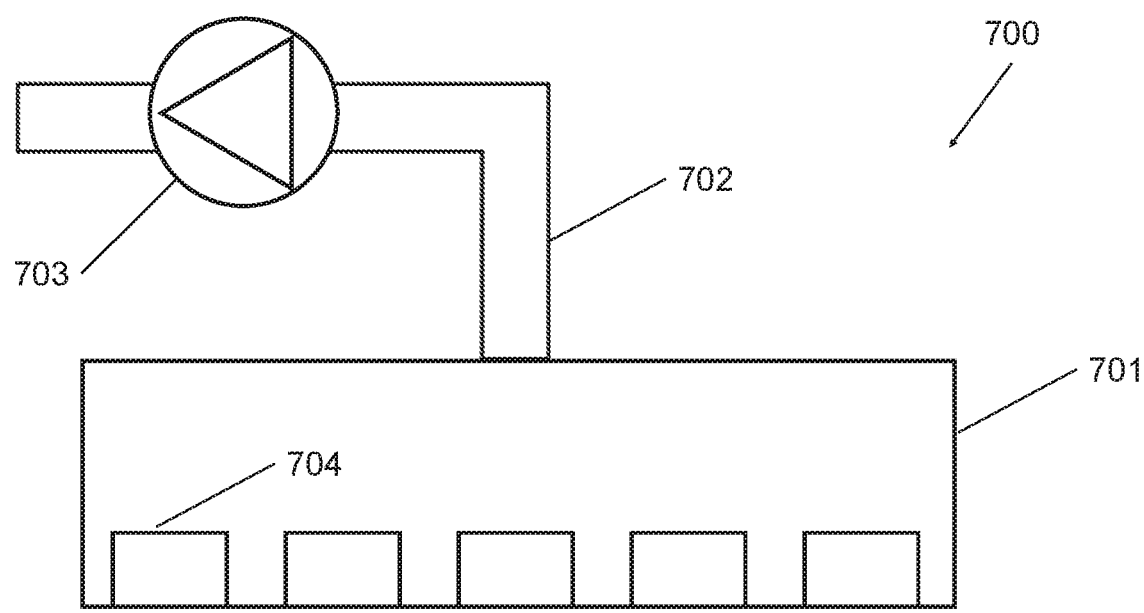
FIGS. 8a and 8b illustrate a particle remover 700 for removing particles from the particle collection region of the apparatus of FIGS. 6a and 6b.
Figure 8B:
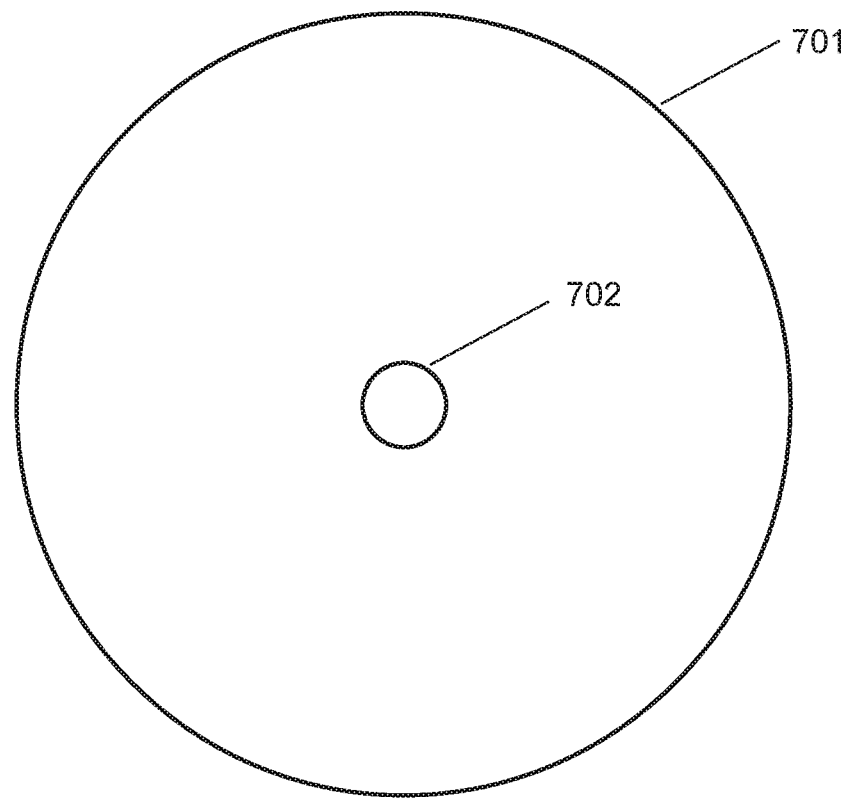

FIGS. 8a and 8b illustrate an exemplary particle remover 700 for removing particles 205 from the particle collection region 301 once they have been transported there by means of the applied electric field E as described above. FIG. 8a is a side view of the particle remover 700 and FIG. 8b is a top down view. The particle remover 700 consists of generally cylindrical cap element 701 connected to the top of which is a nozzle 702. The nozzle 702 is in fluid communication with the cap element 701 and a vacuum pump 703. The fluid may be air, cleaned air or any other gas present in the apparatus. The cap element 701 is dimensioned so as to cover preferably the entire surface of the particle collection region 301. In operation, the vacuum pump 703 draws air through a plurality of vents 704 in the cap element 701 and through the nozzle 702. The turbulent airflow generated in this manner results in a suction force which can remove any contaminant particle 205 collected on the particle collection region 301.

Figure 9A:
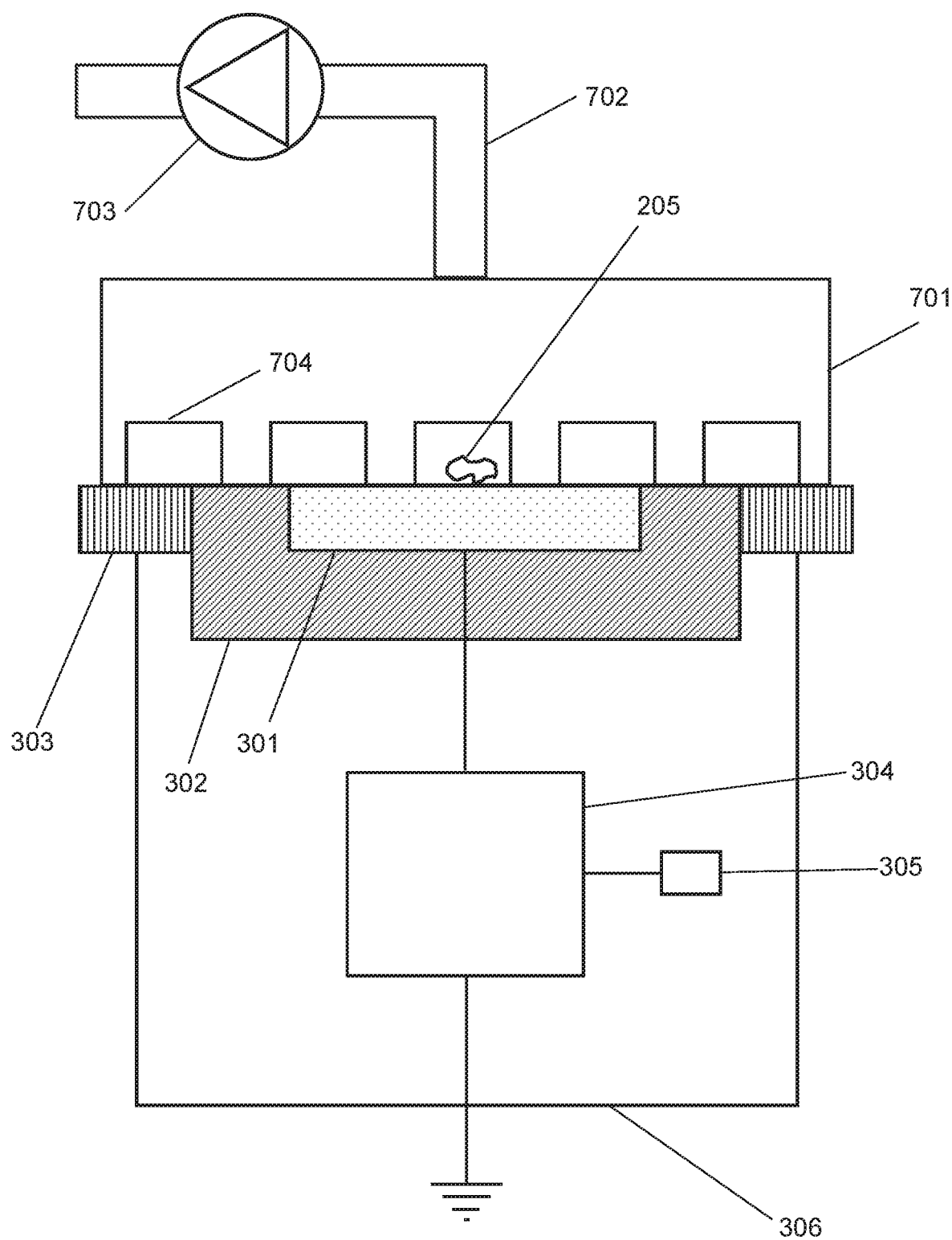
FIGS. 9a and 9b illustrate the use of the particle remover of FIGS. 8a and 8b for removing a particle from the particle collection region of the apparatus of FIGS. 6a and 6b.
Figure 9B:
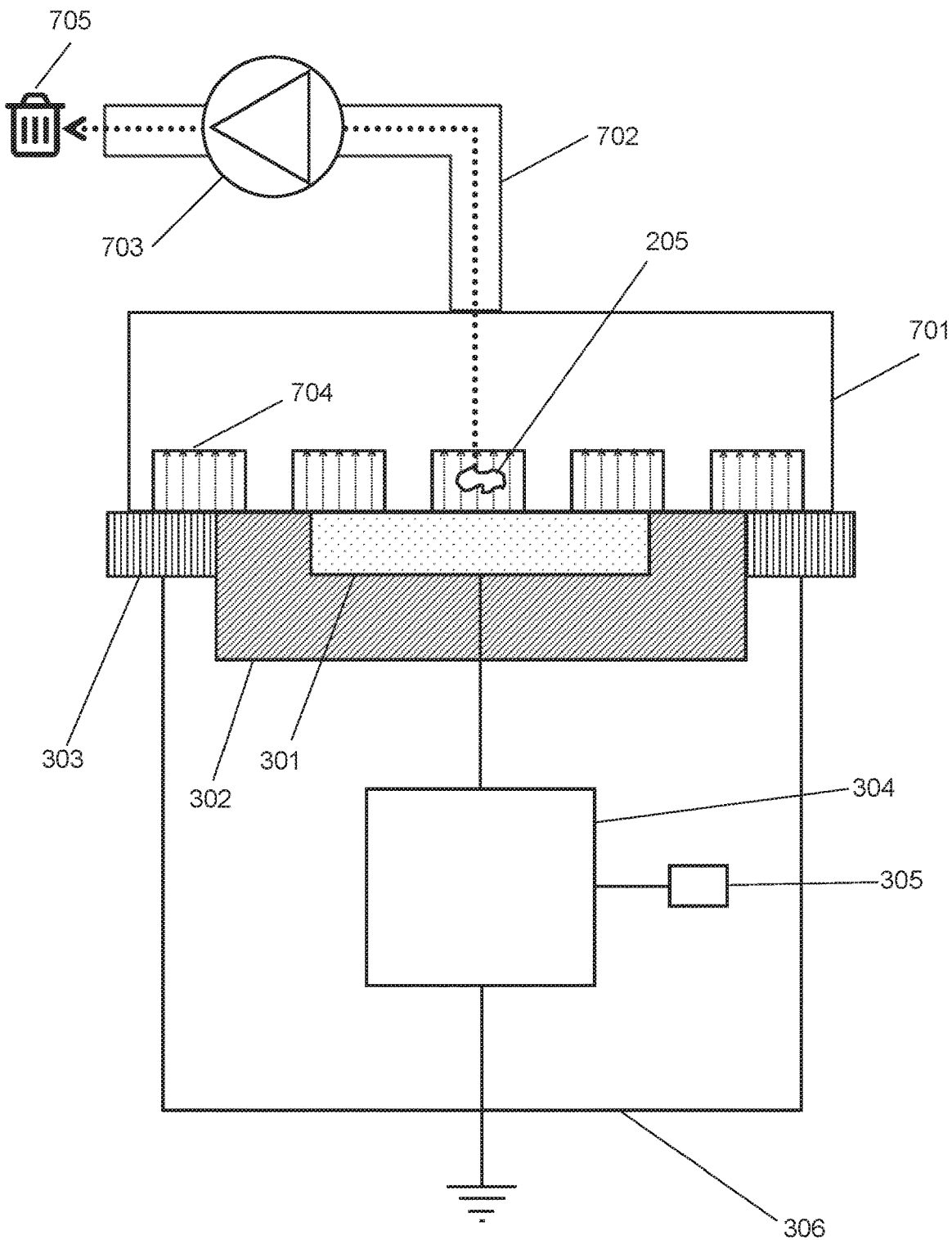

FIGS. 9a and 9b illustrate the use of the particle remover 700 for removing a particle 205 which has been attracted to and retained at the particle collection region 301 by means of an applied electric field E as described above. In FIG. 9a the cap element 701 has been installed over the top of the particle collection region 301 such that the captured contaminant particle 205 is underneath the cap element. The objective 202 has been moved away from apparatus 300 for removing contaminant particles prior to placement of the cap element 701. In FIG. 9a the vacuum pump 703 has not yet been switched on. In this example, the cap element has a diameter such that it completely covers the particle collection region and the electrically insulating region and such that it partially overlaps with the guard. In this manner the particle remover 700 is also effective in removing any particles 205 which extend slightly outside of the particle collection region 301. The applied electric field E may remain switched on whilst the cap element 701 is installed over the particle collection region 301. The cap element may be formed from an electrically insulating material such that it does not significantly interfere with the applied electric field E which exists between the particle collection region 301 and the objective 202.

In FIG. 9b the vacuum pump 703 has been switched on and the applied electric field E is removed, reversed or reduced, if not already done. An air flow is established as indicated by the arrows within vents 704 of the cap element 701. The air flow creates a suction force on the particle 205 which provided the parameters of the vacuum pump 703, cap element 701 and vents 704 are chosen appropriately will result in the particle 205 being drawn up off the surface of the particle collection region 301 and through the nozzle 702 to a safe containment 705.

The inspection unit 400 is used for inspecting the objective 202, to determine whether contaminant particles 205 are present. The inspection unit may comprise a camera system, for example for producing an image of the objective which can then be viewed by an operator or analysed automatically by software to determine the presence of contaminant particles on the objective. Alternatively, the inspection unit may direct a ray of light towards the objective which moves relative the objective, e.g. in a 2D scan across the surface of the objective. A detector may monitor the intensity of light which is transmitted through the objective or reflected from the surface of the objective and compare this against a calibrated intensity scan for a known case where no contaminant particle is present on the objective. If the light ray is blocked or partially scattered by the particle the intensity recorded by the detector will suffer a dip—thereby indicating the presence of a contaminant particle on the objective.

The apparatus 300 for removing contaminant particles 205 from a component of the metrology apparatus MT may also comprise a field inducer configured, prior to establishing the applied electric field, to induce a further electric field in the region between the collection region and the component. The field inducer may be formed of the same components used to generate the applied electric field, i.e. the combined high voltage supply unit and voltage sensing device 304 in combination with the electrically conductive particle collection region. The field inducer may be operated prior to generating the applied electric field in order to establish an inducing electric field which interacts with the contaminant particle. For example, the inducing electric field may impart a charge distribution onto the contaminant particle thereby affecting the ambient electric field. This may be done by arranging the contaminant particle to be in contact with the field inducer whilst the inducing electric field is applied. It is to be noted that care must be taken that the contaminant particle 205 does not receive a too high force from the further electric field such that is moves away from the region in between component 202, 204 and the collection region 301.

An exemplary method for removing contaminant particles 205 from a component 202, 204 of a metrology apparatus MT will now be described with reference to FIG. 10. An initial step S0 entails using an inspection unit 400 to inspect the component for particles. The subsequent method steps may be made in dependence on a threshold number of particles being detected on the component, by means of the decision at S0a. The threshold number may be 1, i.e. the subsequent method steps are performed if any contaminant particles are detected such that there is zero tolerance of contaminant particles on the objective. If no particles are detected the metrology apparatus may continue with its normal operations until a fixed interval of time has passed or a certain number of measurements have been made by the metrology apparatus, at which time the method is repeated starting with step S0 of inspecting the component for particles. This prevents needlessly performing the full method if there are no contaminant particles present on the component and hence minimizes the impact on production time. However, it should be appreciated that step S0 and decision S0a are optional and the method may instead start with step S1 such that there is no step of inspecting the component for particles. The entire method may then be repeated after a fixed period of time or number of cycles, again starting with step S1 without first inspecting the component for the presence of contaminant particles.

At step S1 the electric field generator determines a polarity and magnitude of the applied electric field E based on the ambient electric field. Then, once the polarity and magnitude for the applied electric field have been determined, at step S2 the electric field generator establishes the applied electric field E at the determined polarity and magnitude. The applied electric field is established between the collection region 301 and the component in order to cause the particles to be transported from the component to the collection region.

Once the particles have been transported to the collection region, at step S3 a particle remover removes the particles from the collection region. The particle remover may be that as described above with reference to FIGS. 8 to 9, whereby the cap 701 of the particle remover 700 is placed over the collection region and the vacuum pump 703 is operated to draw a gas through the vents 704 of the cap towards the vacuum pump. This has the effect of removing particles from the particle collection region by suction. During the step S3 the electric field generator will reduce the magnitude of, reverse the polarity of, or entirely remove, the applied electric field E in order to aid the removal of particles by suction. This may be done by reducing the magnitude of the high voltage which is applied to the particle collection region 301 by means of the combined high voltage supply unit and voltage sensing device 304. By reducing the magnitude of the applied electric field in the manner it is expected that the particle 205 will still be held securely at the particle collection region 301 but that the lifetime of components may be enhanced compared to the case where the full magnitude of the applied electric field E were retained for an extended period of time. In the same vein, the objective 202 may be moved away from the particle collection region 301 as soon as or shortly after the particle 205 has been collected.

Figure 10:
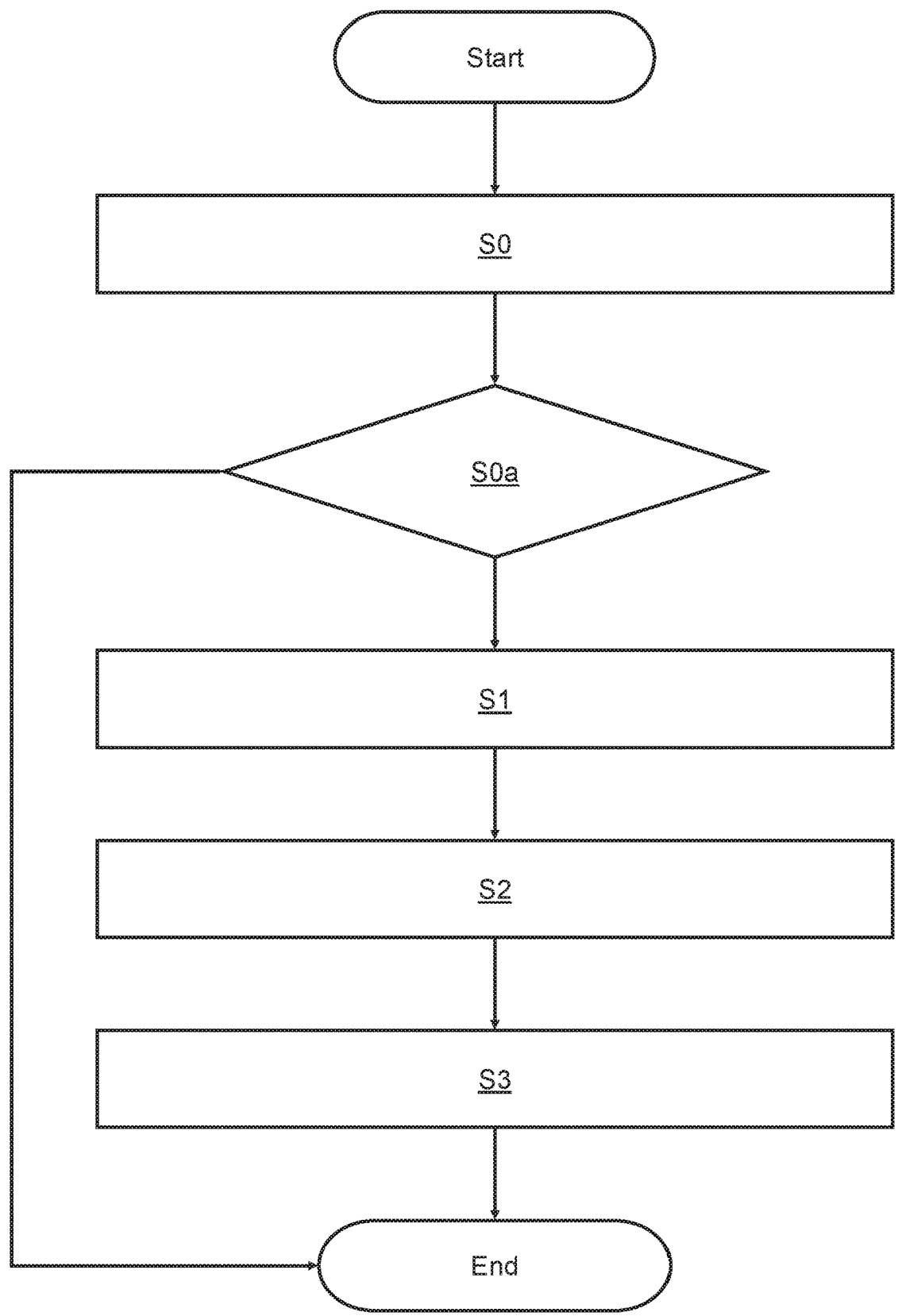
FIG. 10 is a flowchart corresponding to a method for removing contaminant particles from a component of a metrology apparatus.

The method of FIG. 10 may be repeated after a fixed interval of time has passed or a certain number of metrology measurements have been made, which may be the same as for the case when no particles are detected by the inspection unit at step S0 and steps S1-S3 are bypassed. In this manner the particle removal method is run on a continuous periodic basis, but it will also be appreciated that it could also be run manually at the request of an operator if required.

Figure 11:
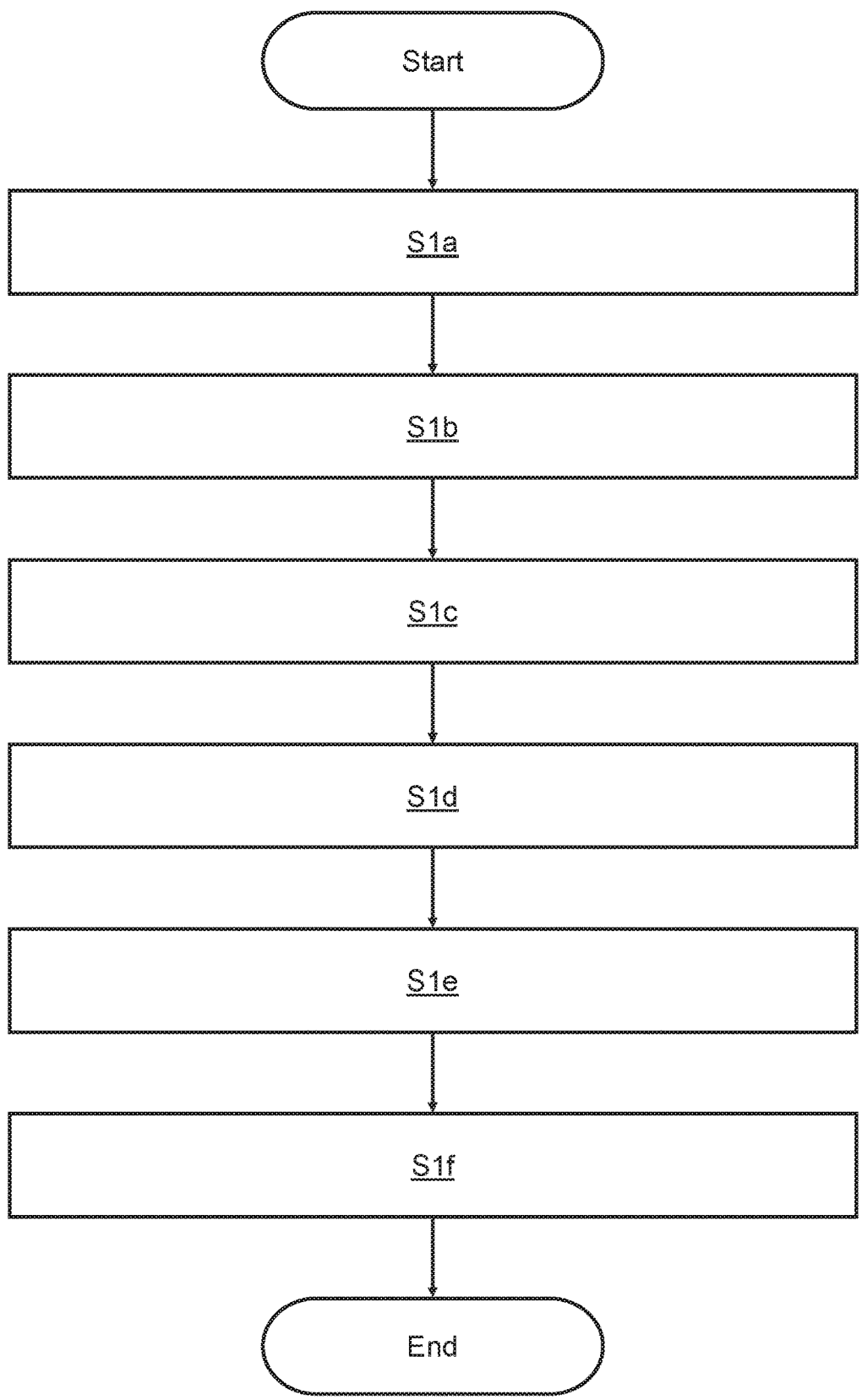
FIG. 11 is a flowchart corresponding to a method for determining the polarity and magnitude of an applied electric field to be generated by the apparatus of FIGS. 6a and 6b.

Step S1 of determining the polarity and magnitude of the applied electric field based on the ambient electric field is described in further detail with reference to FIG. 11. First, at step S1a the high voltage supply of the combined high voltage supply unit and voltage sensing device 304 is switched off and the particle collection region 301 is arranged to be electrically floating with respect to ground potential. Then at step S1b the objective 202 is moved by means of the translation stage 201 to be situated directly above the particle collection region 301 of the apparatus 300. The ambient electric field caused by the particle 205 is then sensed in order to determine its polarity and magnitude. The particle collection region 301 and the combined high voltage supply unit and voltage sensing device 304 are used in an arrangement akin to a charge plate monitor in order to sense the polarity and magnitude of the ambient electric field. In performing this function, at step S1c the particle collection region 301 is connected (e.g. by means of a switch) to the voltage sensing device of the combined high voltage supply unit and voltage sensing device 304. At step S1d the magnitude and polarity of the voltage induced on the particle collection region 301 by the ambient electric field is measured by means of the voltage sensing device. Al step S1e the magnitude and polarity of the ambient electric field are inferred from the magnitude and polarity of the voltage induced on the particle collection region. For example, since the objective 202 is held at ground potential and the voltage induced in the particle collection region has been measured, the ambient electric field may be inferred by dividing the induced voltage by the separation distance between the particle collection region 301 and the objective 202. Finally at step S1f the magnitude and polarity of the applied electric field E are determined in dependence on the inferred magnitude and polarity of the ambient electric field. This involves determining the magnitude and polarity of the high voltage which when applied to the particle collection region 301 gives rise to the determined applied electric field E, which again may include accounting for the separation distance between the particle collection region 301 and the objective 202.

The high voltage determined in step S1f may be constrained so as not to cause an electrical breakdown to occur between the objective 202 and the particle collection region 301. A constraint may also be placed on the minimum separation distance between the objective 202 and the particle collection region 301 during application of the applied electric field E so as to further reduce the chance of an electrical breakdown occurring. Further, determination of the high voltage and resulting applied electric field E may include a library lookup from experimental data and/or the use of an electrostatic finite element model of the apparatus. This may include also taking into account an estimate of an adhesion force holding the particles to the component; and/or an estimation of Van der Waals forces holding the particles to the component. This is because the particle may not be held to the component by means of only an electrostatic force resulting from the ambient electric field but may be influenced by e.g. adhesion forces. These additional forces, as well as the electrostatic force, should be overcome in order to successfully transport the particle from the component to the particle collection region. A computer model or library data may account for these additional force contributions to aid accurate determination of the magnitude and polarity of the applied electric field which will cause the particles to be transported to the particle collection region.

The polarity of the voltage giving rise to the applied electric field determined in step S1f will be opposite from the polarity of the voltage induced in the particle collection region by the ambient electric field. This is so as to establish an applied electric field E which has a polarity opposite from that of the ambient electric field in order to attract the particle 205 towards the particle collection region 301. If the polarity of the ambient electric field and the applied electric field were the same then the particle 205 may be repelled from the particle collection region 301 and be transported to other regions of the metrology apparatus which is undesirable.

Once the polarity and magnitude of the high voltage/ applied electric field E have been determined according to the method described above with reference to FIG. 11, the high voltage supply of the combined high voltage supply unit and voltage sensing device 304 is switched on at the determined high voltage. This establishes the applied electric field E in the region between the particle collection region 301 and the objective 202, i.e. step S2 as described above. This causes an electrostatic force on the particle 205 which overcomes the total forces (sum of electrostatic, adhesive and gravitational forces) holding the particle to the objective 202 and thereby transports the particle 205 from the objective 202 to the surface of the particle collection region 301, as illustrated in FIGS. 7*b* and 7*c*. Once the particle 205 has reached the surface of the particle collection region 301, FIG. 7*c*, it is held in place by the applied electric field E until subsequent removal step S3 has taken place.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a metrology apparatus, embodiments of the invention may be used in other apparatuses. Embodiments of the invention may form part of a mask inspection apparatus, a wafer inspection apparatus that detects deviations from an expected pattern, a lithographic apparatus, or any apparatus that measures or processes an object such as a wafer (or other substrate) or mask (or other patterning device) These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

A computer program may be configured to provide any of the above described methods. The computer program may be provided on a computer readable medium. The computer program may be a computer program product. The product may comprise a non-transitory computer usable storage medium. The computer program product may have computer-readable program code embodied in the medium configured to perform the method. The computer program product may be configured to cause at least one processor to perform some or all of the method.

Various methods and apparatus are described herein with reference to block diagrams or flowchart illustrations of computer-implemented methods, apparatus (systems and/or devices) and/or computer program products. It is understood that a block of the block diagrams and/or flowchart illustrations, and combinations of blocks in the block diagrams and/or flowchart illustrations, can be implemented by computer program instructions that are performed by one or more computer circuits. These computer program instructions may be provided to a processor circuit of a general purpose computer circuit, special purpose computer circuit, and/or other programmable data processing circuit to produce a machine, such that the instructions, which execute via the processor of the computer and/or other programmable data processing apparatus, transform and control transistors, values stored in memory locations, and other hardware components within such circuitry to implement the functions/acts specified in the block diagrams and/or flowchart block or blocks, and thereby create means (functionality) and/or structure for implementing the functions/acts specified in the block diagrams and/or flowchart block(s).

Computer program instructions may also be stored in a computer-readable medium that can direct a computer or other programmable data processing apparatus to function in a particular manner, such that the instructions stored in the computer-readable medium produce an article of manufacture including instructions which implement the functions/acts specified in the block diagrams and/or flowchart block or blocks.

A tangible, non-transitory computer-readable medium may include an electronic, magnetic, optical, electromagnetic, or semiconductor data storage system, apparatus, or device. More specific examples of the computer-readable medium would include the following: a portable computer diskette, a random access memory (RAM) circuit, a read-only memory (ROM) circuit, an erasable programmable read-only memory (EPROM or Flash memory) circuit, a portable compact disc read-only memory (CD-ROM), and a portable digital video disc read-only memory (DVD/Blu-ray).

The computer program instructions may also be loaded onto a computer and/or other programmable data processing apparatus to cause a series of operational steps to be performed on the computer and/or other programmable apparatus to produce a computer-implemented process such that the instructions which execute on the computer or other programmable apparatus provide steps for implementing the functions/acts specified in the block diagrams and/or flowchart block or blocks.

Further embodiments are provided in the subsequent numbered clauses:

1. An apparatus for removing contaminant particles from a component of an apparatus, the contaminant particles giving rise to an ambient electric field, the apparatus comprising:
a collection region for attracting the particles, wherein the ambient electric field is at least between the component and the collection region; and an electric field generator configured to establish an applied electric field between the collection region and the component to cause the particles to be transported from the component to the collection region, wherein the electric field generator is configured to determine the polarity of the applied electric field based on the ambient electric field.

2. The apparatus according to clause 1, wherein the polarity of the applied electric field is opposite to the polarity of the ambient electric field.

3. The apparatus according to clause 1 or 2, wherein the electric field generator is configured to determine a magnitude of the applied electric field based on one or more of: a magnitude of the ambient field; an estimate of an adhesion force holding the particles to the component; and an estimation of Van der Waals forces holding the particles to the component.

4. The apparatus according to any preceding clause, wherein at least part of the collection region is electrically conductive, and wherein the electric field generator comprises a voltage source arranged to establish the applied electric field by applying a voltage to the at least part of the collection region.

5. The apparatus according to any preceding clause, further comprising a field sensor configured, prior to establishing the applied electric field, to sense the polarity of the ambient electric field, wherein the field sensor is optionally configured, prior to establishing the applied electric field, to sense the magnitude of the ambient electric field.

6. The apparatus according to clause 5, wherein the field sensor comprises an electrically conductive element, and wherein sensing the ambient electric field comprises monitoring a voltage induced in the electrically conductive element by the ambient electric field.

7. The apparatus according to clause 6, configured to allow a voltage of the electrically conductive element to be floating when sensing the ambient electric field.

8. The apparatus according to any of clauses 5 to 7, wherein the magnitude of the applied electric field is determined based on at least one of a magnitude of the sensed ambient electric field and a distance between the component and the electrically conductive element and/or the collection region.

9. The apparatus according to any of clauses 5 to 8, wherein the collection region comprises the electrically conductive element.

10. The apparatus according to any preceding clause, further comprising a field inducer configured, prior to establishing the applied electric field, to induce a further electric field in the region between the collection region and the component, while, optionally, the collection region touches the contaminant particles.

11. The apparatus according to any preceding clause, wherein the component is an objective of an optical system.

12. The apparatus according to any preceding clause when dependent directly or indirectly on clause 4, wherein the magnitude of the applied voltage is in the range from 0 V to 10 kV.

13. The apparatus according clause 12, wherein the magnitude of the applied voltage is determined so as to prevent electrical breakdown between the component and the collection region.

14. The apparatus according to any preceding clause, wherein the component is held at ground potential.

15. The apparatus according to any preceding clause, further comprising an inspection unit configured to undertake an initial step of inspecting the component for particles, and wherein the electric field generator is configured to establish the applied electric field in dependence on a threshold number of particles being detected on the component.

16. The apparatus according to any preceding clause, wherein the electric field generator is configured to determine the polarity and/or magnitude of the applied electric field based on a library lookup from experimental data and/or an electrostatic finite element model of the apparatus, taking the polarity and/or magnitude of the ambient electric field as inputs.

17. The apparatus according to any preceding clause, wherein prior to establishing the applied electric field the component is translated to be located directly above the collection region or the collection region is translated to be located directly below the component.

18. The apparatus according to any preceding clause, further comprising a particle remover configured to remove the particles from the collection region.

19. The apparatus according to clause 18, wherein the particle remover comprises a vacuum pump and wherein removal of the particles from the collection region is by suction.

20. The apparatus according to clause 19, further comprising a cap for placement over the collection region, the cap having vents that are in fluid communication with the vacuum pump, and configured on operation of the vacuum pump to draw a gas therethrough, across the collection region and towards the vacuum pump.

21. The apparatus according to any of clauses 18 to 20, wherein the electric field generator is configured to reduce the magnitude of the applied electric field before or during operation of the vacuum pump.

22. The apparatus according to clause 21, wherein the electric field generator is configured to remove the applied electric field before or during operation of the vacuum pump.

23. The apparatus according to clause 21 wherein the electric field generator is configured to reverse the polarity of the applied electric field before or during operation of the vacuum pump.

24. The apparatus according to any preceding clause further comprising a guard at a periphery of the collection region, the guard being configured to hold the applied electric field in a region adjacent to the collection region.

25. The apparatus according to clause 24, wherein at least part of the guard is electrically conductive and is held at ground potential.

26. The apparatus according to clauses 1 to 25, wherein the component is of a metrology apparatus.

27. A method for removing contaminant particles from a component of an apparatus, the contaminant particles giving rise to an ambient electric field and the apparatus comprising a collection region for attracting the particles, wherein the ambient electric field is at least between the component and the collection region, the method comprising:

determining, by an electric field generator, a polarity of an applied electric field based on the ambient electric field; and establishing, by the electric field generator, the applied electric field of the determined polarity between the collection region and the component to cause the particles to be transported from the component to the collection region.

28. The method according to clause 27, wherein determining the polarity and magnitude of the applied electric field is based on at least one of: a magnitude of the ambient electric field; an estimate of an adhesion force holding the particles to the component; and an estimate of the Van der Waals force holding the particles to the component.

29. The method according to clause 27 or 28, wherein the electric field generator comprises a voltage source, and wherein establishing the applied electric field comprises the voltage source applying a voltage to a part of the collection region which is electrically conductive.

30. The method according to any of clauses 27 to 29, further comprising, prior to establishing the applied electric field, sensing, by a field sensor, the polarity of the ambient electric field and further comprising the optional stage of, prior to establishing the applied electric field, sensing, by a field sensor, the magnitude of the ambient electric field.

31. The method according to clause 30, wherein the field sensor comprises an electrically conductive element, and wherein sensing the ambient electric field comprises monitoring a voltage induced in the electrically conductive element by the ambient electric field.

32. The method according to clause 31, further comprising allowing a voltage of the electrically conductive element to be floating when sensing the ambient electric field.

33. The method according to any of clauses 30 to 32, further comprising determining the magnitude of the applied electric field based on at least one of a magnitude of the sensed ambient electric field and a distance between the component and the electrically conductive element and/or the collection region.

34. The method according to any of clauses 27 to 33, further comprising inducing, by a field inducer and prior to establishing the applied electric field, a further electric field in the region between the collection region and the component, while, optionally, allowing the collection region to touch the contaminant particles.

35. The method according to any of clauses 27 to 34, wherein the magnitude of the applied voltage is in the range from 0 V to 10 kV.

36. The method according clause 35, further comprising determining the magnitude of the applied voltage so as to prevent electrical breakdown between the component and the collection region.

37. The method according to any of clauses 27 to 36, further comprising holding the component at ground potential.

38. The method according to any of clauses 27 to 37, further comprising an initial step of inspecting, by an inspection unit, the component for particles, and the electric field generator establishing the applied electric field in dependence on a threshold number of particles being detected on the component.

39. The method according to any of clauses 27 to 38, further comprising the electric field generator determining the polarity and/or magnitude of the applied electric field based on a library lookup from experimental data and/or an electrostatic finite element model of the apparatus, taking the polarity and/or magnitude of the ambient electric field as inputs.

40. The method according to any of clauses 27 to 39, further comprising prior to establishing the applied electric field, translating the component to be located directly above the collection region or alternatively translating the collection region to be located directly below the component.

41. The method according to any of clauses 27 to 40, further comprising a particle remover removing the particles from the collection region.

42. The method according to clause 41, wherein the particle remover comprises a vacuum pump and wherein removal of the particles from the collection region is by suction.

43. The method according to clause 42, further comprising placing a cap over the collection region, the cap having vents that are in fluid communication with the vacuum pump, and operating the vacuum pump to draw a gas therethrough, across the collection region and towards the vacuum pump.

44. The method according to any of clauses 41 to 43, further comprising the electric field generator reducing the magnitude of the applied electric field before or during operation of the vacuum pump.

45. The method according to clause 44, further comprising the electric field generator removing the applied electric field before or during operation of the vacuum pump.

46. The method according to clause 44 further comprising the electric field generator reversing the polarity of the applied electric field before or during operation of the vacuum pump.

47. The method according to any of clauses 27 to 46, further comprising holding a guard located at a periphery of the collection region at ground potential to hold the applied electric field in a region adjacent to the collection region.

48. The method according to any of the clauses 27 to 47 wherein the component is of a metrology apparatus.

49. A computer program comprising instructions which, when executed on at least one processor, cause the at least one processor to control an apparatus to carry out a method according to any one of clauses 27 to 48.

50. A carrier containing the computer program according to clause 49, wherein the carrier is one of an electronic signal, optical signal, radio signal, or non-transitory computer readable storage medium.

51. A metrology apparatus comprising the apparatus according to any one of clauses 1 to 26.

52. A lithographic apparatus comprising the apparatus according to any one of the clauses 1 to 26 or according to clause 51.

53. A lithographic cell comprising the apparatus according to clause 52.

54. An apparatus for removing contaminant particles from a component of an apparatus, the contaminant particles giving rise to an ambient electric field, the apparatus comprising:
a collection region for attracting the particles, wherein the ambient electric field is at least between the component and the collection region;
an electric field generator; and
a processor configured to undertake the steps of:
determining the polarity of the applied electric field based on the ambient electric field; and
causing the electric field generator to establish an applied electric field between the collection region and the component to cause the particles to be transported from the component to the collection region.

Accordingly, the invention may be embodied in hardware and/or in software (including firmware, resident software, micro-code, etc.) that runs on a processor, which may collectively be referred to as "circuitry," "a module" or variants thereof.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. An apparatus for removing contaminant particles from a component of an inspection apparatus, the apparatus comprising:
a collection region configured to attract the contaminant particles removed from the component, wherein the contaminant particles give rise to an ambient electric field based on an electrostatic force between the component and the contaminant particles and the ambient electric field is at least between the component and the collection region;
an insulating layer configured to surround a portion of the collection region; and
an electric field generator configured to establish an applied electric field between the collection region and the component to cause the contaminant particles to be transported from the component to the collection region, wherein the polarity of the applied electric field is based on the ambient electric field.

2. The apparatus of claim 1, wherein the polarity of the applied electric field is opposite to the polarity of the ambient electric field.

3. The apparatus of claim 1, wherein the electric field generator is configured to determine the magnitude of the applied electric field based on one or more of: a magnitude of the ambient field, an estimate of an adhesion force holding the particles to the component, and an estimation of Van der Waals forces holding the particles to the component.

4. The apparatus of claim 1, wherein:
at least part of the collection region is electrically conductive, and
the electric field generator comprises a voltage source arranged to establish the applied electric field by applying a voltage to the at least part of the collection region.

5. The apparatus of claim 1, further comprising:
a field sensor configured, prior to establishing the applied electric field, to sense the polarity of the ambient electric field.

6. The apparatus of claim 5, wherein:
the field sensor comprises an electrically conductive element,
sensing the ambient electric field comprises monitoring a voltage induced in the electrically conductive element by the ambient electric field, and
the apparatus is configured to allow a voltage of the electrically conductive element to be floating when sensing the ambient electric field.

7. The apparatus of claim 6, wherein a magnitude of the applied electric field is determined based on at least one of a magnitude of the sensed ambient electric field and a distance between the component and the electrically conductive element and/or the collection region.

8. The apparatus of claim 1, further comprising a field inducer configured, prior to establishing the applied electric field, to induce a further electric field in the region between the collection region and the component, while the collection region touches the contaminant particles.

9. The apparatus of claim 1, further comprising:
a particle remover configured to remove the particles from the collection region.

10. The apparatus of claim 9, wherein:
the particle remover comprises a vacuum pump, and
the removal of the particles from the collection region is by suction.

11. The apparatus of claim 10, further comprising:
a cap configured for placement over the collection region, the cap having vents that are in fluid communication with the vacuum pump, and configured on operation of the vacuum pump to draw a gas therethrough, across the collection region and towards the vacuum pump.

12. The apparatus of claim 9, wherein:
the electric field generator is configured to reduce the magnitude of the applied electric field before or during operation of the vacuum pump, and one of:
the electric field generator is configured to remove the applied electric field before or during operation of the vacuum pump, or
the electric field generator is configured to reverse the polarity of the applied electric field before or during operation of the vacuum pump.

13. The apparatus of claim 1, further comprising:
a guard at a periphery of the insulating layer, the guard being configured to hold the applied electric field in a region adjacent to the collection region, and
wherein at least part of the guard is electrically conductive and is held at ground potential.

14. A metrology apparatus comprising the apparatus of claim 1.

* * * * *